(12) United States Patent
Kitazawa et al.

(10) Patent No.: US 8,692,370 B2
(45) Date of Patent: Apr. 8, 2014

(54) SEMICONDUCTOR DEVICE WITH COPPER WIRE BALL-BONDED TO ELECTRODE PAD INCLUDING BUFFER LAYER

(75) Inventors: Takashi Kitazawa, Kumagaya (JP); Yasushige Sakamoto, Ota (JP); Motoaki Wakui, Kumagaya (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 272 days.

(21) Appl. No.: 13/203,439

(22) PCT Filed: Feb. 25, 2010

(86) PCT No.: PCT/JP2010/053487
§ 371 (c)(1),
(2), (4) Date: Aug. 25, 2011

(87) PCT Pub. No.: WO2010/098500
PCT Pub. Date: Sep. 2, 2010

(65) Prior Publication Data
US 2011/0304046 A1    Dec. 15, 2011

(30) Foreign Application Priority Data

Feb. 27, 2009 (JP) ................................. 2009-045569
Mar. 31, 2009 (JP) ................................. 2009-085847

(51) Int. Cl.
*H01L 23/49* (2006.01)
(52) U.S. Cl.
USPC .................... 257/738; 257/784; 257/E23.033
(58) Field of Classification Search
USPC .............................................. 257/E23.025
See application file for complete search history.

(56) References Cited

U.S. PATENT DOCUMENTS

| 4,984,056 A * | 1/1991 | Fujimoto et al. ............... 257/753 |
| 6,627,981 B2 * | 9/2003 | Shibata ......................... 257/678 |
| 6,700,186 B2 | 3/2004 | Yasunaga et al. |
| 7,335,529 B2 | 2/2008 | Miyaki et al. |
| 7,404,513 B2 * | 7/2008 | Kadoguchi et al. ......... 228/180.5 |
| 7,728,414 B2 | 6/2010 | Omori et al. |
| 7,889,513 B2 | 2/2011 | Shimanuki |
| 2007/0001283 A1 * | 1/2007 | Laska et al. ................... 257/692 |
| 2008/0246129 A1 | 10/2008 | Oga |

FOREIGN PATENT DOCUMENTS

| JP | 7-29943 | 1/1995 |
| JP | 2001-313363 | 11/2001 |
| JP | 2002-83918 | 3/2002 |
| JP | 2003-303919 | 10/2003 |
| JP | 2005-86200 | 3/2005 |
| JP | 2006-318996 | 11/2006 |
| JP | 2007-184385 | 7/2007 |
| JP | 2008-153709 | 7/2008 |
| JP | 2008-277751 | 11/2008 |

* cited by examiner

*Primary Examiner* — Stephen W Smoot

(57) ABSTRACT

A semiconductor element (10) is secured to an island (7), and a plurality of through-holes (8) are formed in the portion of the island (7), which surrounds the area to which the semiconductor element (10) is secured. Further, the electrode pads of the semiconductor element (10) and leads (4) are electrically connected by copper wires (11). In this structure, the cost of materials is reduced by using the copper wires (11) in comparison with gold wires. Further, a part of a resin package (2) is embedded in through-holes (8), so that the island (7) can be easily supported within the resin package (2).

4 Claims, 17 Drawing Sheets

SEMICONDUCTOR DEVICE WITH COPPER WIRE BALL-BONDED TO ELECTRODE PAD INCLUDING BUFFER LAYER

REFERENCE TO RELATED APPLICATIONS

This application is a national stage application under 35 USC 371 of International Application No. PCT/JP2010/053487, filed Feb. 25, 2010, which claims priority from Japanese Patent Application No. 2009-045569, filed Feb. 27, 2009, and Japanese patent Application No. 2009-085847, filed Mar. 31, 2009, the contents of which are incorporated herein by reference in their entirety.

FIELD OF THE INVENTION

The present invention relates to a semiconductor device on which wire bonding is performed by using a copper wire and a method for manufacturing the same.

BACKGROUND OF THE INVENTION

In Japanese Patent Application Publication No. Hei 7-29943, the following manufacturing method is known as an embodiment of a conventional method of manufacturing a semiconductor device. Parts (A) and (B) of FIG. 7 are cross-sectional views for explaining the conventional method of manufacturing a semiconductor device.

Firstly, as shown in Part (A) of FIG. 7, a semiconductor element 42 is fixedly attached to a die pad 41 of a lead frame, and then the lead frame is placed on a wire bonding apparatus. An electrode pad 43 of the semiconductor element 42 is heated to about 200° C., and then a capillary 44 is moved to above the electrode pad 43. Then, a metal ball formed at a tip end of the capillary 44 is connected with the electrode pad 43 by a technique of thermal compression bonding in combination with ultrasonic vibration. This process is generally referred to as ball bonding.

Next, as shown in Part (B) of FIG. 7, the capillary 44 is moved to above a tip end of an inner lead 46, and a thin metal wire 45 is pressed against the inner lead 46 at any desired load. At this time, the inner lead 46 is heated to about 200° C., and the thin metal wire 45 is connected with the inner lead 46 by the technique of thermal compression bonding in combination with ultrasonic vibration. Subsequently, the capillary 44 is moved up with a wire clamper 47 closed, so that the thin metal wire 45 is cut off at a connection point with the inner lead 46. This process is generally referred to as stitch bonding.

Then, the wire bonding operation described with reference to Parts (A) and (B) of FIG. 7 is repeated to electrically connect all the electrode pads 43 of the semiconductor element 42 with the inner leads 46 by the thin metal wires 45.

Meanwhile, in Japanese Patent Application Publication No. 2005-86200, the following manufacturing method is known as another embodiment of the conventional method of manufacturing a semiconductor device. Parts (A) to (C) of FIG. 17 are cross-sectional views for explaining the conventional method of manufacturing a semiconductor device.

Firstly, as shown in Part (A) of FIG. 17, a semiconductor chip 112 is mounted on a wiring substrate 111. Multiple electrode pads 113 are arranged on an upper surface of the semiconductor chip 112, and a metal ball 115 formed at a tip end of a capillary 114 is connected with each of the electrode pads 113. Subsequently, the capillary 114 is moved up with a wire clamper 116 closed, so that a thin metal wire 117 is cut off from the metal ball 115.

Then, as shown in Part (B) of FIG. 17, the capillary 114 is moved to above the metal ball 115 with the thin metal wire 117 being drawn from the tip end of the capillary 114. Next, stitch bonding is performed on the metal ball 115, so that the thin metal wire 117 drawn from the tip end of the capillary 114 is connected with the metal ball 115. Thereafter, the capillary 114 is moved to above a wiring layer 118 with the wire clamper 116 opened.

Then, as shown in Part (C) of FIG. 17, stitch bonding is performed on the wiring layer 118, so that the thin metal wire 117 drawn from the tip end of the capillary 114 is connected with the wiring layer 118. Subsequently, the capillary 114 is moved up with the wire clamper 116 closed, so that the thin metal wire 117 is cut off at a connection point with the wiring layer 118.

SUMMARY OF THE INVENTION

As described above, in the wire bonding process, the thin metal wire 45 is under a high-temperature condition during the wire bonding operation on all the electrode pads 43. The conventional techniques use a gold wire as the thin metal wire in this process, which makes a problem of oxidization at this time negligible.

However, when a copper wire is used as the thin metal wire 45, there arises a problem that the copper wire is oxidized during the operation. In particular, in a manufacturing method based on a MAP (matrix array packaging method), many mounting portions are arranged at a lead frame. Accordingly, many wires need to be bonded by wire bonding, and thus a long working time is required. In this case, the problem of oxidization is nonnegligible. In addition, there arises a problem that the die pad 41, the inner lead 46 or the like may be oxidized by the above operation if they are not treated through plate processing or other similar processing.

Meanwhile, in the conventional technique, the multiple inner leads 46 are collectively wire-bonded while being fixed with a clamper (unillustrated). In comparison between the gold wire and the copper wire as a material of the thin metal wire 45, the gold wire is softer and less ductile than the copper wire. For this reason, the gold wire is so readily cut off in stitch bonding that a state of the lead fixed by the clamper is not particularly considered important.

However, since the copper wire is harder but more ductile than the gold wire, the copper wire receives higher load in the stitch bonding than the gold wire. For this reason, if there is a gap between the clamper and the lead, some load in the stitch bonding is lost, and thus cutting of the thin metal wire 45 is difficult. This causes a problem that the thin metal wire 45 is difficult to stably cut at its proper position. In addition, if the gap is present between the clamper and the lead, the lead is not fixed in a favorable state, and some load in the wire bonding is easily lost. This causes a problem that a connection failure easily occurs.

Moreover, the gold wire involves a higher material cost than the copper wire, and thus has a problem that the cost price is increased. Besides, the gold wire has a larger specific resistance and thus has a smaller current capacity than the copper wire. For this reason, a semiconductor element handling a large current needs to use a large amount of gold wires, which brings about a problem of an extra material cost.

Furthermore, the copper wire is harder than the gold wire. For this reason, when a copper ball is directly boned to an electrode pad made of, for example, aluminium, the electrode pad softer than the copper wire forcedly moves to the surroundings of the copper ball and forms a splash around the copper ball. The splash causes a problem of making adjacent electrode pads short-circuited. In addition, there is also a problem that an insulating layer below the electrode pads is damaged, for example cracked, due to an impact at the time of the ball bonding of the copper ball.

Particularly when each electrode pad itself is made thin for preventing such splash from causing a short circuit, damage to the insulating layer below the electrode pad as described above is further increased. Further, most of the electrode pad under the bottom surface of the copper ball moves as the splash, and thus a connection region between the copper ball and the electrode pad is decreased. Thereby, there arises a problem that the connection resistance value thereof is increased or a connection failure occurs.

A semiconductor device according to the invention made in view of the above situation includes: an island, a plurality of leads arranged to surround the island, a semiconductor element fixedly attached onto the island with an adhesive, copper wires which electrically connect electrode pads of the semiconductor element and the leads, respectively, and a resin package which covers the island, the leads, the copper wires, and the semiconductor element. A plurality of through-holes are formed in the island around a fixing region of the semiconductor element, and the through-holes are filled with a resin which forms the resin package. Accordingly, in the invention, use of the copper wire leads to reduction of the material cost. In addition, utilization of the through-holes leads to enhancement of the adherence between the island and the resin package.

A method of manufacturing a semiconductor device according to the invention includes: preparing a lead frame provided with a group block including a group of mounting portions each including an island provided with a plurality of through-holes, a plurality of leads arranged to surround the island, and a support lead extended from the island; after a semiconductor element is fixedly attached onto the island, bonding electrode pads of the semiconductor element to the leads, respectively, through wire-bonding using copper wires to thereby complete electrical connection in the group block; covering the group block with a resin to form a resin package; and cutting the resin package into individual pieces. The through-holes are located above a gas exhaust hole provided in a placement stage of a wire bonding apparatus, and an inert gas supplied to the mounting portions is exhausted from the gas exhaust hole through the through-holes. Accordingly, in the invention, space around the wire-bonded copper wire is easily filled with the inert gas, and thereby oxidization of the copper wire is prevented.

A semiconductor device according to the invention includes: an island, a plurality of leads arranged to surround the island, a semiconductor element fixedly attached onto the island with an adhesive, copper wires which electrically connect electrode pads of the semiconductor element and the leads, respectively, and a resin package which covers the island, the leads, the copper wires, and the semiconductor element. The copper wires are ball-bonded to the leads, respectively, and stitch-bonded to gold balls formed on the electrode pads, respectively. Accordingly, in the invention, use of the copper wire leads to reduction of the material cost. In addition, formation of the gold ball on the electrode pad leads to prevention of a short circuit with adjacent electrode pads.

A method of manufacturing a semiconductor device according to the invention includes: preparing a lead frame provided with a group block including a group of mounting portions each including an island provided with a plurality of through-holes, a plurality of leads arranged to surround the island, and a support lead extended from the island; after a semiconductor element is fixedly attached onto the island and gold balls are formed on an electrode pad of the semiconductor element, bonding the gold balls to the leads, respectively, through wire-bonding using a copper wires, to thereby complete electrical connection in the group block, covering the group block with a resin to form a resin package; and cutting the resin package into individual pieces. The through-holes are located above a gas exhaust hole provided in a placement stage of a wire bonding apparatus, and an inert gas supplied to the mounting portions is exhausted from the gas exhaust hole through the through-holes. Accordingly, in the invention, space around the wire-bonded copper wire is easily filled with the inert gas, and thereby oxidization of the copper wire is prevented.

In the invention, the wire bonding is performed by using the copper wire, and thereby the material cost is reduced in comparison with a case of using a gold wire.

Moreover, in the invention, the through-holes in the island are buried with part of the resin package, so that the adherence between the island and the resin package is enhanced.

Further, in the invention, the inert gas supplied to a wire bonding region is exhausted through the through-holes formed in the island. Moreover, space around the wire-bonded copper wire is easily filled with the inert gas, and thereby oxidization of the copper wire is prevented Still further, in the invention, wire bonding work is performed while the multiple leads are individually fixed by a clamper. Loss of some load at the time of stitch bonding is prevented, and a cutting position of the copper wire is determined stably. In addition, a favorable connection state can be achieved.

Furthermore, in the invention, the resin is filled into the through-holes of the island up to the back side of the support lead, and thereby a structure can be achieved in which the island does not easily come off the resin package. In addition, in the invention, formation of the gold ball on the electrode pad leads to prevention of a short circuit with adjacent electrode pads due to splash.

In the invention, a buffer layer is formed in the electrode pad, and thereby a crack can be prevented from occurring in the insulating layer below the electrode pad.

DETAILED DESCRIPTION OF THE INVENTION

Figure 1A:
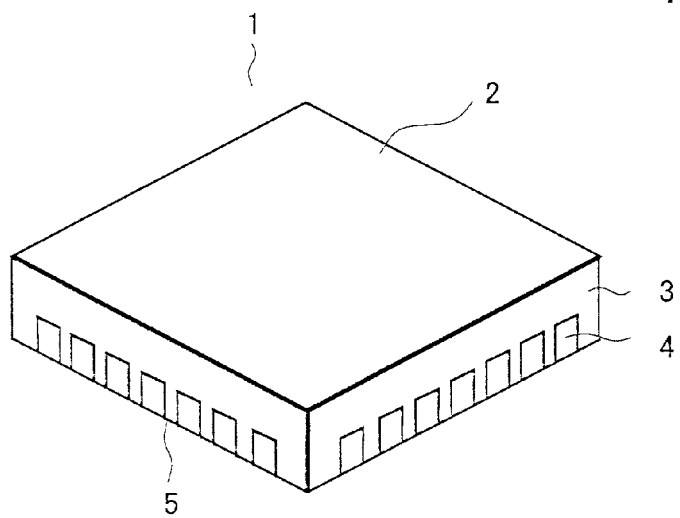
FIG. 1 is a view for describing a semiconductor device according to an embodiment of the present invention, Part (A) is a perspective view, Part (B) is a perspective view, Part (C) is a cross-sectional view, and Part (D) is a perspective view, Part (E) is a perspective view.
Figure 1D:
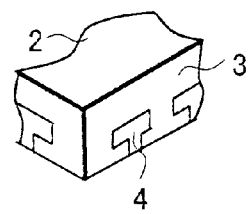
Figure 1B:
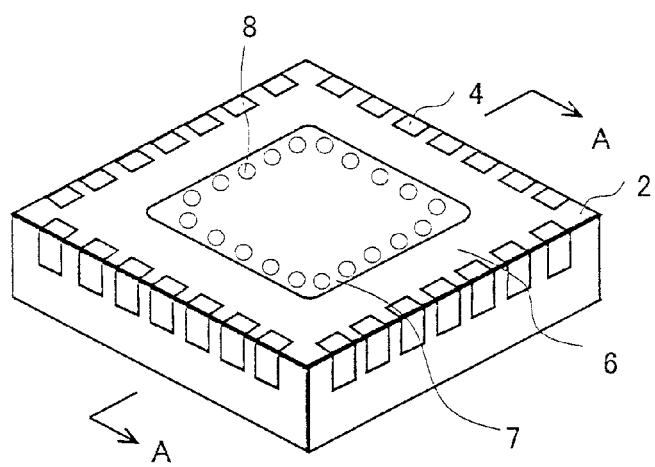
Figure 1E:
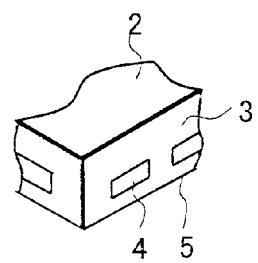
Figure 1C:
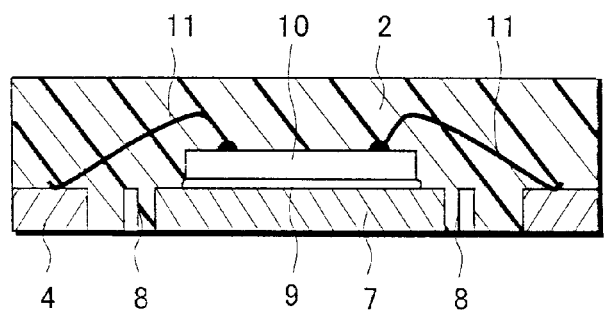
Figure 2A:
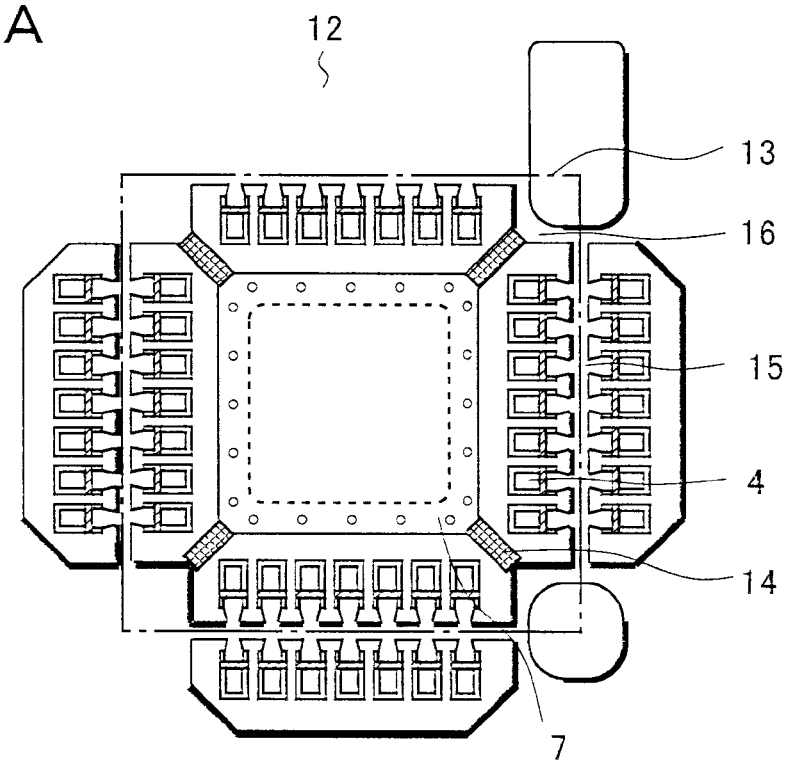
FIG. 2 is a view for describing the semiconductor device according to the embodiment of the present invention, Part (A) is a plan view and Part (B) is a plan view.
Figure 2B:
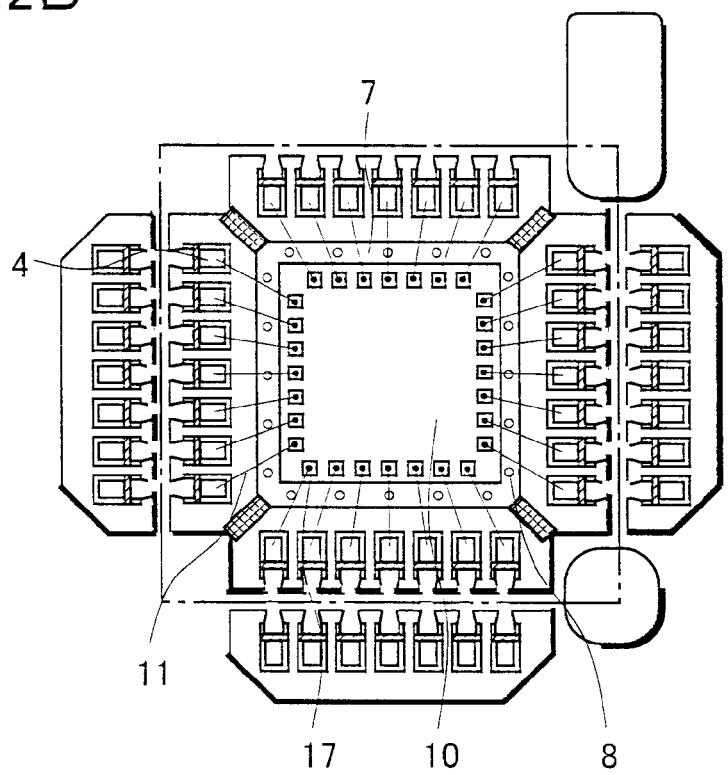

Hereinbelow, a description is given of a semiconductor device according to an embodiment of the invention. Parts (A), (B), (D), and (E) of FIG. 1 are perspective views for explaining a resin package. Part (C) of FIG. 1 is a cross-sectional view for explaining the resin package. Part (A) of FIG. 2 is a plan view for explaining a lead frame. Part (B) of FIG. 2 is a view showing a state resulting from wire bonding performed on the lead frame in Part (A) of FIG. 2.

As shown in Part (A) of FIG. 1, a semiconductor device 1 is formed by a resin package 2 based on the MAP, for example. As described later by using FIG. 6, group blocks are encapsulated collectively and then divided into pieces by dicing, and thus leads 4 are exposed from side surfaces 3 of the resin package 2. The exposed leads 4 form surfaces flush with the side surfaces 3 of the resin package 2. Note that the exposed shape of the leads 4 is not limited to a shape illustrated therein. For example, as shown in Part (D) of FIG. 1, a case may be employed in which an exposed surface of each lead 4 has a T-shape for preventing the wear of a dicing blade. Alternatively, as shown in Part (E) of FIG. 1, a case may be employed in which a dicing region on the back side of the lead 4 is half-etched, and an exposed surface of the lead 4 is spaced away from side edges 5 of the resin package 2 and located closer to a front surface of the resin package 2.

As shown in Part (B) of FIG. 1, an island 7 is exposed from a back surface 6 of the resin package 2, and the island 7 forms a surface approximately flush with the back surface 6 of the resin package 2. Multiple through-holes 8 are formed in the island 7 in a periphery region in the island 7. The through-holes 8 are filled with an insulating resin to form the resin package 2. The leads 4 are exposed from the back surface 6 of the resin package 2 and are arranged in such a manner as to surround the island 7.

Part (C) of FIG. 1 is a cross-sectional view of the semiconductor device taken in a direction of the A-A line in Part (B) of FIG. 1 and shows a cross section including the through-holes 8 formed in the island 7. As illustrated therein, a semiconductor element 10 is fixedly attached to the island 7 with an adhesive 9 of, for example, a Ag paste, solder or the like. An electrode pad of the semiconductor element 10 and a corresponding one of the leads 4 are electrically connected with each other by using a copper wire 11 which is a subject of the present application. A copper wire 11 having a diameter of, for example, 33 μm to 50 μm and made of 99.9 wt % to 99.99 wt % of copper is used. The copper wire 11 is ball-bonded to the electrode pad of the semiconductor element 10 and stitch-bonded to the lead 4. Note that any design change can be made to the diameter of the copper wire 11 according to the usage.

The island 7 is formed by a frame mainly made of copper having a thickness of, for example, about 100 μm to 250 μm. The island 7 includes the multiple through-holes 8 formed therein. Although the details will be described later, the through-holes 8 are utilized as flowing passages of an inert gas (forming gas) at the time of die bonding or wire bonding, and thus are arranged in a peripheral region of a fixing region of the semiconductor element 10. Each through-hole 8 is buried in the insulating resin at the time of resin molding. With this structure, a region of adhesion between the resin package 2 and the island 7 is increased, and the resin enters in the island 7, so that the island 7 is securely supported in the resin package 2. In the resin package 2, low molecular components contained, for example, in the resin package 2 and the adhesive 9 evaporate due to driving heat or the like in the semiconductor element 10, so that a gas is generated. Due to the aforementioned gas, the island 7 receives an external force in a direction of being extruded from the resin package 2. In particular, in a thin package in which the island 7 is exposed on the back surface 6 side of the resin package 2, the adherence between the island 7 and the resin package 2 is weak, and thus the island 7 is easily extruded from the resin package 2 due to the aforementioned gas. Hence, enhancing the adherence between the resin package 2 and island 7 in an annular manner along the periphery of the island 7 leads to a structure in which the island 7 does not easily come off the resin package 2.

Furthermore, the through-hole 8 is also utilized as an exhaust passage of the aforementioned gas generated in the resin package 2, particularly around the island 7. The gas is exhausted to the outside of the resin package 2 through the through-hole 8 in a short path, and thereby the island 7 is difficult to extrude to the outside of the resin package 2 due to the gas.

Figure 3:
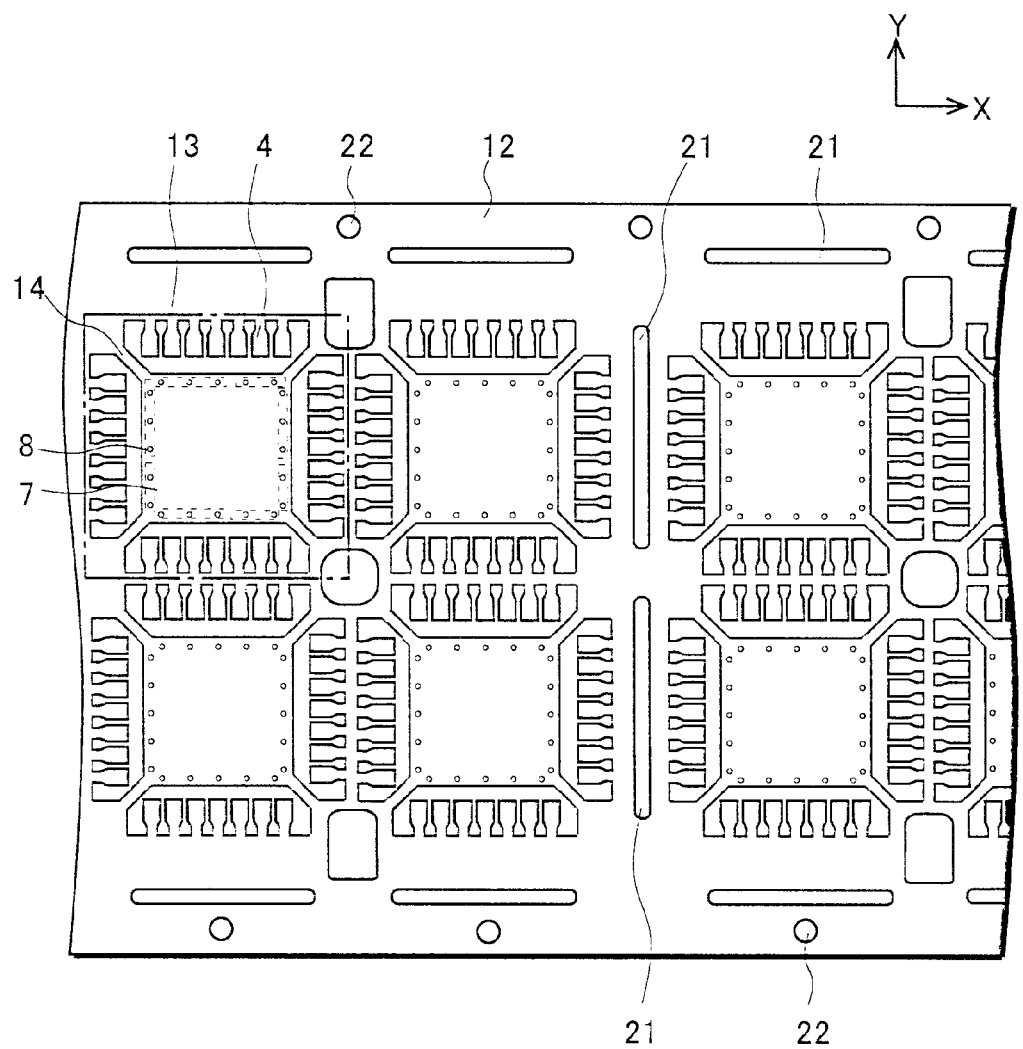
FIG. 3 is a plan view for describing a semiconductor device manufacturing method according to an embodiment of the invention.

As shown in Part (A) of FIG. 2, a frame mainly made of copper is generally used as a lead frame 12. However, a case may be employed in which a frame mainly made of Fe—Ni, and another case may be employed in which the frame is mainly made of a different metal material. The lead frame 12 made of such a material has multiple mounting portions 13 formed thereon shown by a dashed-dotted line. Note that the figure shows one of the mounting portions 13, but as shown in FIG. 3, the four mounting portions 13, for example, are grouped to form one group block. Then, resin molding is performed collectively on each group block.

Each mounting portion 13 mainly includes the island 7, support leads 14 supporting the island 7, the leads 4 located near four sides of the island 7, and tie bars 15 each supporting the corresponding ones of the leads 4. The support leads 14 extend from four corners of the island 7, respectively, and are coupled to supporting regions 16 at which the tie bars 15 cross each other. The supporting regions 16 are integral with the lead frame 12, and thus the island 7 is supported by the lead frame 12. A region indicated by a dotted line in the island 7 is the fixing region for the semiconductor element 10, and thus the through-holes 8 which are features of the invention are arranged in locations such that the fixing region is surrounded.

Hatched regions of the support leads 14 are etched by approximately 0.05 µm to 0.15 µm from the back surface side of the lead frame 12, and thus are recessed regions. Then, the resin is filled into the recessed regions of the support leads 14, and the support leads 14 are supported in the resin package 2, so that an anchor effect is obtained.

Meanwhile, due to the aforementioned gas generated in the resin package 2 and the adhesive 9, the island 7 might receive the external force of extruding the island 7 from the resin package 2. For this case, the structure has been employed in which the island 7 is supported in the resin package 2 by the support leads 14 so that the island 7 does not easily come off the resin package 2. Note that as shown in Part (B) of FIG. 1, there is a structure in which the support leads 14 are not exposed from the back surface 6 of the resin package 2.

Hatched regions of the leads 4 are also etched by, for example, approximately 0.05 µm to 0.18 µm from the back surface side of the lead frame 12, and thus are recessed regions. The hatched recessed regions represent dicing lines. With this structure, the lead frame 12 can easily divided into the individual resin packages 2.

As shown in Part (B) of FIG. 2, the semiconductor element 10 is fixedly attached to the island 7, and electrode pads 17 and the leads 4 are electrically connected with each other via copper wires 11. Meanwhile, there is a need for preventing oxidization of each copper wire 11, a connection portion between the copper wire 11 and a corresponding one of the electrode pads 17, and the like. As described later by using Part (B) of FIG. 4, a structure in which the inert gas is exhausted through the through-holes 8 is provided, and thus the inert gas flows from an upper portion of the resin package 2 to bonding regions, so that regions in which the copper wires 11 are arranged are easily filled with the inert gas at any time. Although the copper wires 11 are made of an easily oxidized material, the presence of the inert gas prevents the oxidization. As a result, the copper wires 11 can be used as a wire bonding material, instead of gold wires which are an inert and stable material, and the use of the copper wires 11 reduces the material cost.

Each through-hole 8 has a shape of a circle, an ellipse or a rectangle and a width equal to or larger than an interval between adjacent ones of the leads 4. This structure increases a suction force of the inert gas and prevents the oxidization of each copper wire 11. The serving of the through-hole 8 as a passage of the inert gas prevents oxidization of side surfaces of the through-hole 8, and thus the adherence with the insulating resin filling the through-hole 8 is enhanced.

Meanwhile, suppose a case of a semiconductor element in which a large current is handled. In this case, when gold wires are used, multiple gold wires are used for a single electrode pad to handle the large current. In contrast, copper wires have a smaller specific resistance and a larger current capacity, and thus the large current can be handled with a smaller number of copper wires than the gold wires. Consequently, the area of the bonding regions can be made smaller than in the case of the gold wires, and thus miniatualization of a semiconductor element can be achieved.

Note that the description has been given of the resin package 2 based on the MAP in this embodiment, but the embodiment is not limited to the package. For example, also in an individual-molding-type package like a package based on a QFP (quad flat package) method, a package based on a QFN (quad flat non-leaded package) method, or the like, providing through-holes in an island enables wire bonding using copper wires, and an effect similar to the one described above can be obtained. In addition, various modifications can be made without departing from the gist of the invention.

Figure 4A:
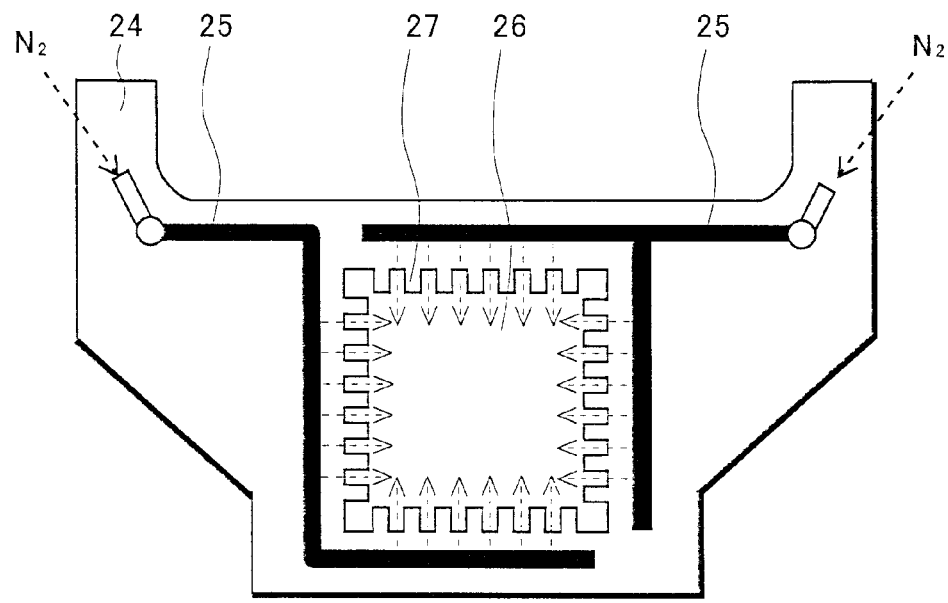
FIG. 4 is a view for describing the semiconductor device manufacturing method according to the embodiment of the invention, Part (A) is a plan view and Part (B) is a cross-sectional view.
Figure 4B:
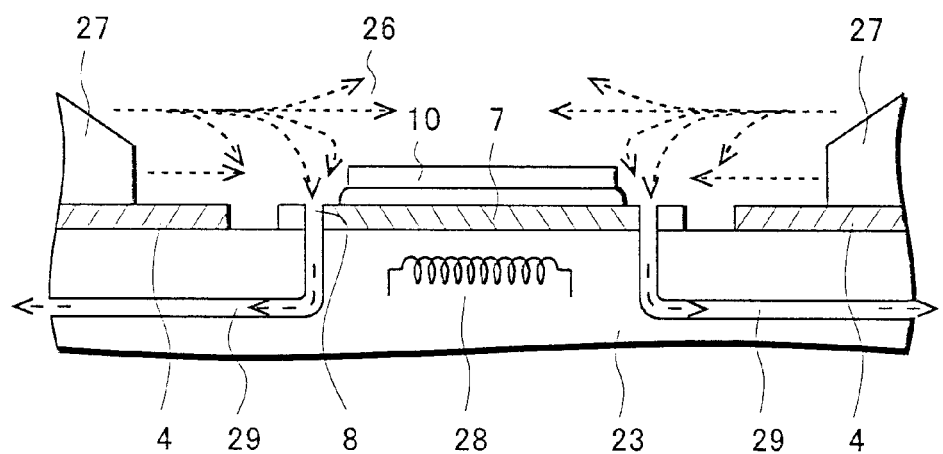
Figure 5A:
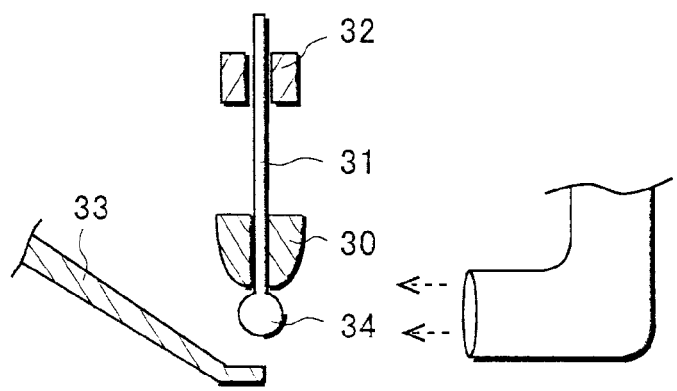
FIG. 5 is a view for describing the semiconductor device manufacturing method according to the embodiment of the invention, Part (A) is a cross-sectional view, Part (B) is a cross-sectional view, and Part (C) is a cross-sectional view.
Figure 5B:
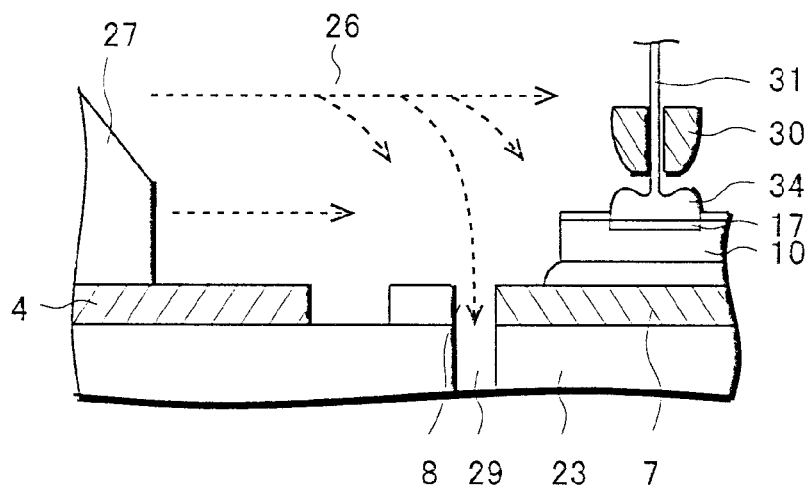
Figure 5C:
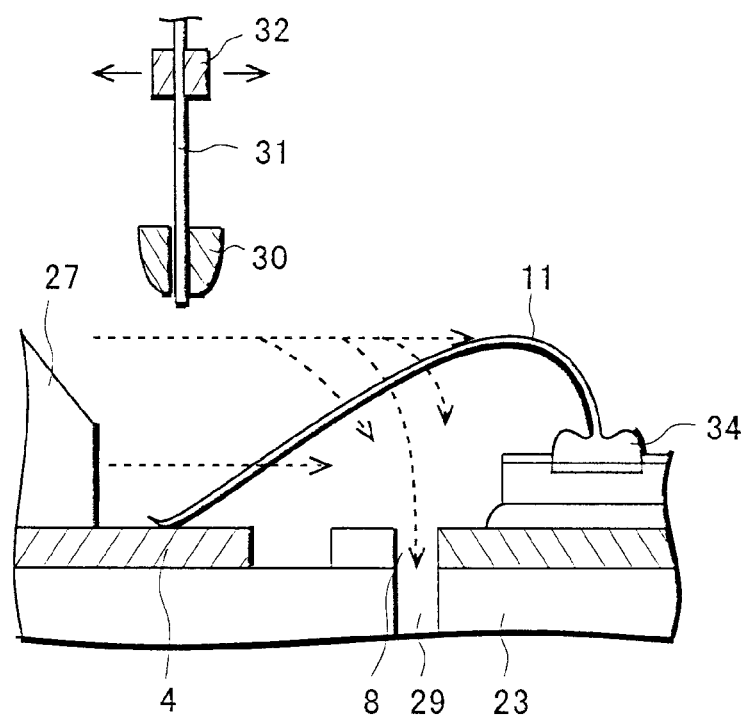
Figure 6A:
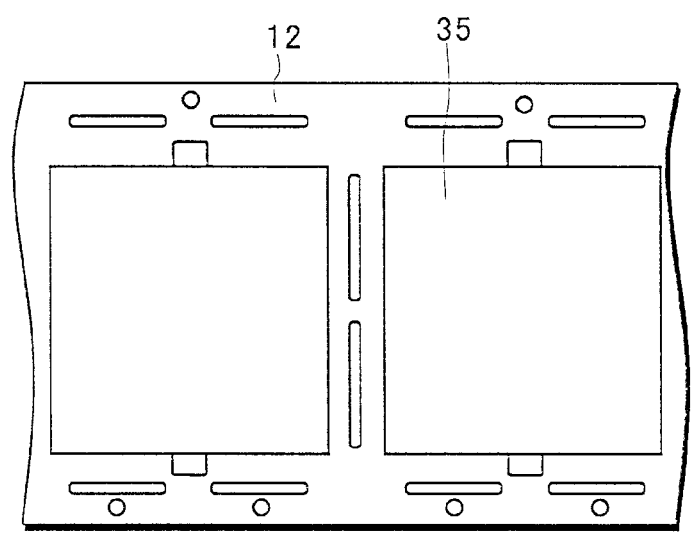
FIG. 6 is a view for describing the semiconductor device manufacturing method according to the embodiment of the invention, Part (A) is a plan view and Part (B) is a cross-sectional view.
Figure 6B:
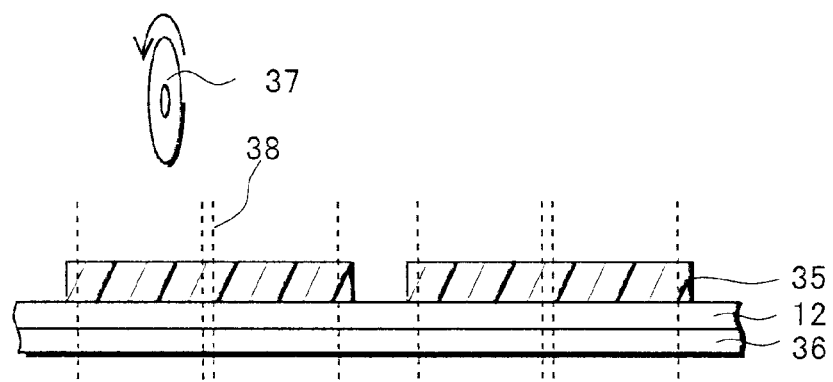
Figure 7A:
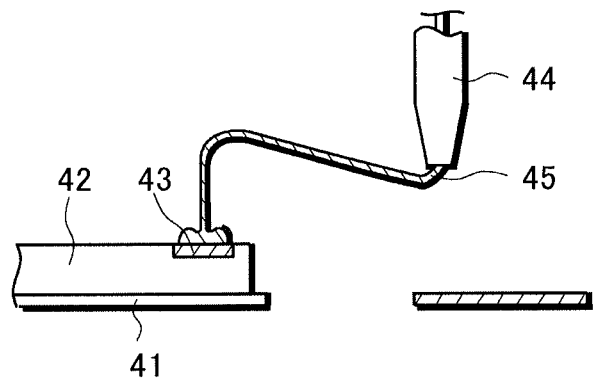
FIG. 7 is a view for describing a semiconductor device manufacturing method according to a conventional embodiment, Part (A) is a cross-sectional view and Part (B) is a cross-sectional view.
Figure 7B:
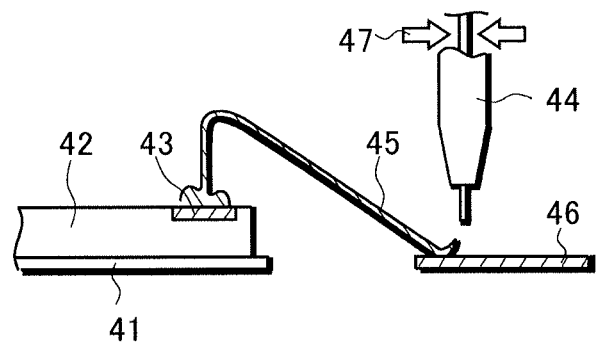
Figure 8A:
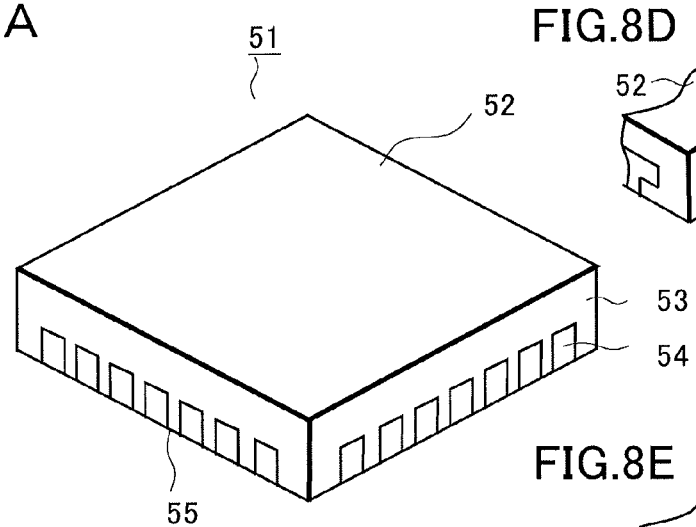
FIG. 8 is a view for describing a semiconductor device according to another embodiment of the invention, Part (A) is a perspective view, Part (B) is a perspective view, Part (C) is a cross-sectional view, Part (D) is a perspective view, and Part (E) is a perspective view.
Figure 8D:
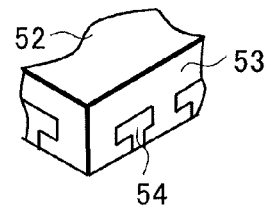
Figure 8E:
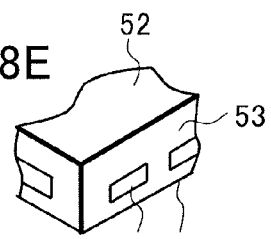
Figure 8B:
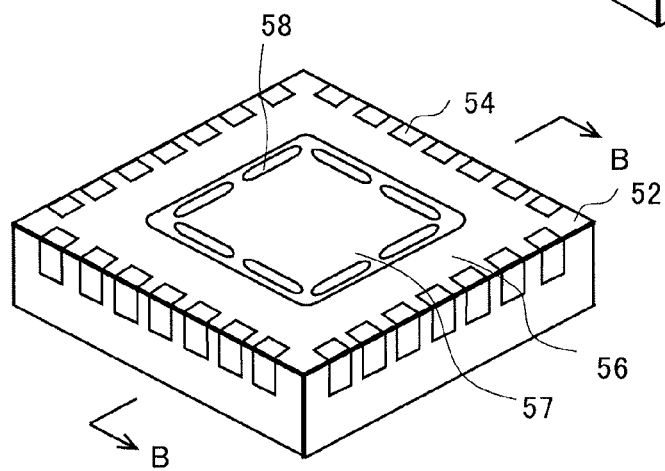
Figure 8C:
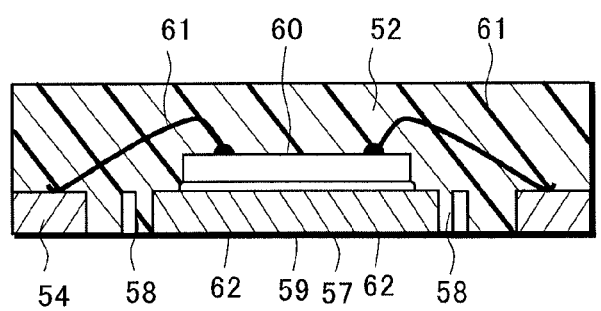

Next, a description is given of a semiconductor device manufacturing method according to an embodiment of the invention. FIG. 3 is a plan view for explaining a lead frame. Part (A) of FIG. 4 is a plan view for explaining a clamper. Part (B) of FIG. 4 is a cross-sectional view for explaining a flow of the inert gas at the time of wire bonding. Parts (A) to (C) of FIG. 5 are cross-sectional views for the wire bonding step. Part (A) of FIG. 6 is a plan view for explaining a resin molding step. Part (B) of FIG. 6 is a cross-sectional view for explaining a dicing step. It should be noted that in the following description, the same components of the semiconductor device as those described by using FIGS. 1 and 2 are denoted by the same reference numerals. In the description of the manufacturing method in this embodiment, FIG. 1 and FIG. 2 are used as appropriate for the description.

Firstly, as shown in FIG. 3, a lead frame 12 mainly made of, for example, copper is prepared. As described above by using Part (A) of FIG. 2, multiple mounting portions 13 are formed at the lead frame 12 as shown by the dashed-dotted line. The lead frame 12 is divided into sections at regular intervals in a longitudinal direction (an X axis direction in the drawing) based on slits 21. In each of the sections divided based on the slits 21, a single group block formed by aggregating, for example, the four mounting portions 13 is formed. Multiple group blocks are formed along the longitudinal direction of the lead frame 12. Also in the longitudinal direction of the lead frame 12, index holes 22 are provided at regular intervals in each of upper and lower edge regions of the lead frame 12, which are used for positioning in the steps mentioned above. Note that the detailed structure of each mounting portion 13 has been described with reference o Part (A) of FIG. 2.

As described later by using Part (B) of FIG. 4, a region shown by dotted lines in FIG. 3 corresponds to a region in which gas exhaust holes 29 are arranged in a placement stage 23. For example, multiple through-holes 8 are arranged above one of the gas exhaust holes 29. With this structure, even though the lead frame 12 is slightly displaced in placing the lead frame 12 on the placement stage 23, an inert gas can be reliably sucked through each through-hole 8. Note that in this embodiment, a dimensional relationship between the through-hole 8 and the gas exhaust hole 29 is not limited to the aforementioned case, and a case in an inverse relationship may be employed. In this case, the multiple gas exhaust holes 29 are arranged below one of the through-holes 8, and thereby the inert gas can be reliably sucked through the through-hole 8 even though the lead frame 12 is slightly displaced. Also in this case, an adhesion region is increased due to the size of the through-holes 8, and thus the adherence between the through-holes 8 and the insulating resin is further enhanced.

Next, as shown in Part (B) of FIG. 2, a semiconductor element 10 is fixedly attached to each mounting portion 13 of the lead frame 12 by using an adhesive 9 on an island 7 (see Part (C) of FIG. 1). In this step, the lead frame 12 is placed on a placement stage of a die bonding apparatus having a heating mechanism incorporated therein, and a clamper fixes the lead frame 12. Then, in a state where the island 7 of the lead frame 12 and the inside of a work region thereof are heated at, for example, approximately 250° C. to 260° C., the semiconductor element 10 is fixedly attached to the island 7. The work is repeated, thus being performed on the multiple islands 7. As is similar in detail to a flow of the inert gas in the wire bonding step to be described with reference to Part (B) of FIG. 4, the inert gas is made flow into the work region of the lead frame 12 from the clamper for fixing the lead frame 12. Then, the inert gas is exhausted toward a placement stage through the through-holes 8 of the island 7, and thereby space around the lead frame 12 is filled with the inert gas. As the result, the lead frame 12, which is mainly made of copper, is placed under a high-temperature condition for a long time, but oxidization thereof is prevented.

Next, as shown in Parts (A) and (B) of FIG. 4, and Parts (A) to (C) of FIG. 5, the lead frame 12 is placed on the placement stage 23 of a wire bonding apparatus, and the wire bonding is performed on each mounting portion 13 of the lead frame 12.

First of all, a description is given of a clamper 24 shown in Part (A) of FIG. 4. The clamper 24 includes pipes 25 through which the inert gas is fed and an opening region 26 opened in accordance with the size of the mounting portion 13. The inert gas blown through the pipes 25 of the clamper 24 blows into the opening region 26, passing through between lead fixing regions 27. When a copper wire 11 has a diameter of 45 μm, a nitrogen gas (containing a little hydrogen gas) of, for example, 1.9 liters per minute is used. Although the copper wire 11 is placed in the work region under the high-temperature condition and thus is in a state where oxidization of the copper wire 11 can easily occur, the oxidization thereof is prevented due to the presence of the aforementioned inert gas.

Further, in the clamper 24 around the opening region 26, the multiple lead fixing regions 27 are arranged in a comb shape in accordance with the shape of the leads 4 in the mounting portion 13. The leads 4 are individually fixed on the placement stage 23 (see Part (B) of FIG. 4) by using the lead fixing regions 27. On the lead 4 side, the stitch bonding in the wire bonding is performed. Meanwhile, the copper wire 11 is harder but more ductile than a gold wire. Thus, in order to cut the copper wire 11 without fail, the load (load applied from a capillary 30 (see Part (A) of FIG. 5) at the time of the stitch bonding is made higher than that applied to the gold wire. The multiple leads 4 are individually fixed by using the lead fixing regions 27 of the clamper 24 which correspond to the shapes of the respective leads 4, and thereby the loss of the load at the stitch bonding is prevented. Thus, the copper wire 11 is cut while securely adhering to the corresponding lead 4. The cut position of the copper wire 11 becomes stable, and thus the shape of the cut copper wire 11 becomes stable.

Next, a description is given of the flow of the inert gas shown in Part (B) of FIG. 4. The placement stage 23 having a heating mechanism 28 includes the gas exhaust holes 29 formed therein. The lead frame 12 is placed on the placement stage 23 in such a manner that the through-holes 8 of the island 7 are located above the gas exhaust holes 29. As shown in the dotted arrows, the inert gas is blown through between the lead fixing regions 27 of the clamper 24 toward the center of the opening region 26 (the mounting portion). In other words, the inert gas is blown into the opening region 26 from the entire periphery thereof toward the center. The opening region 26 is not covered. If the inside of the opening region 26 is in the high-temperature condition, the inert gas is released to above the opening region 26 due to an ascending air current. Hence, in this embodiment, the inert gas is sucked from the gas exhaust holes 29 in the placement stage 23 through the through-holes 8, so that the inert gas blown from the lead 4 side flows mainly toward the through-holes 8 of the island 7. As the result, the inert gas flows mainly to below the opening region 26 (toward the placement stage 23), and a region in which the copper wire 11 is arranged becomes a region to be readily filled with the inert gas.

The temperature in the work region which is in the opening region 26 of the clamper 24 is maintained at, for example, 250° C. to 260° C. by the heating mechanism 28. Wire-bonded ones of the copper wires 11 are left in the work region in the high-temperature condition until wire bonding of all the electrodes of the semiconductor element 10 is completed (for example, until wire bonding of all the semiconductor elements 10 in one group block is completed). Hence, the aforementioned flow of the inert gas is generated, and thereby the space around the copper wires 11 is easily filled with the inert gas, so that the copper wires 11 are efficiently prevented from being oxidized. Although the lead frame 12 including the leads 4 and the like is also in the state where oxidization easily occurs, the flowing of the inert gas toward the placement stage 23 efficiently prevents the lead frame 12 as well from being oxidized.

Note that not all of the inert gas blown into the opening region 26 is sucked from the gas exhaust holes 29 in the placement stage 23, and some of the inert gas flows to above the opening region 26. Then, the opening region 26 and the vicinity thereof become a region filled with the inert gas.

Next, as shown in Part (A) of FIG. 5, a copper wire 31 is inserted into a center hole of the capillary 30, and a wire clamper 32 for holding the copper wire 31 is arranged above the capillary 30. Then, the wire clamper 32 is opened, the copper wire 31 in any desired length is drawn from a tip end of the capillary 30, electricity is discharged from a torch 33 located near the capillary 30, and an initial ball 34 is formed at the tip end of the capillary 30. Note that when the copper wire 31 having a diameter of 45 μm is used, a current of, for example, 125 mA is required in forming the initial ball 34. In contrast, when a gold wire having the same diameter is used to form an initial ball, a current of, for example, 75 mA is required. The current difference derives from the following. The copper wire 31 has a higher thermal conductivity than the gold wire, is a material having higher heat dissipation, and is easily cooled due to the inert gas. Note that, as illustrated therein, the aforementioned inert gas is supplied to a work region in which the initial ball 34 is formed. For this reason, a redox behavior due to hydrogen contained in the inert gas causes a spherical shape of the initial ball 34 to be formed stably.

Next, as shown in Part (B) of FIG. 5, the capillary 30 is moved down to above an electrode pad 17 of the semiconductor element 10 and presses the initial ball 34 against an upper surface of the electrode pad 17. Then, the initial ball 34 formed at the tip end of the capillary 30 is connected with the electrode pad 17 by the technique of thermal compression bonding in combination with ultrasonic vibration. Incidentally, the wire clamper 32 is opened at the time of this work.

Next, as shown in Part (C) of FIG. 5, in the state where the wire clamper 32 is opened, the capillary 30 is moved to above the lead 4 while drawing a certain loop trajectory. Then, after the wire clamper 32 holds the copper wire 31, the capillary 30 is moved down to above the lead 4 and presses the copper wire 31 against an upper surface of the lead 4. Next, the copper wire 31 is connected with the lead 4 by the technique of thermal compression bonding in combination with ultrasonic vibration. Subsequently, the capillary 30 is moved up, so that the copper wire 31 is cut. Thereafter, the wire bonding work described by using Parts (A) to (C) of FIG. 5 is repeatedly performed on each electrode pad 17 of the semiconductor element 10 and the corresponding lead 4. As described above, the leads 4 are individually fixed by the lead fixing regions 27 on the placement stage 23 of the clamper 24, and thereby the copper wire 31 is securely cut.

Next, as shown in Part (A) of FIG. 6, resin molding is performed on each group block on the lead frame 12 to form common resin packages 35. For example, a sheet 36 for resin molding (see Part (B) of FIG. 6) is attached to the lead frame 12 on the back surface side, and then the lead frame 12 is placed in a resin encapsulation mold. Subsequently, an insulating resin is filled into the resin encapsulation mold, and thereby the common resin packages 35 are formed on a group block basis. As described above, each common resin package 35 includes the four mounting portions 13.

Lastly, as shown in Part (B) of FIG. 6, the common resin packages 35 on the lead frame 12 are cut on a mounting portion 13 basis to be divided into individual resin packages 2. In cutting, a dicing blade 37 of a dicing apparatus is used to simultaneously dice the common resin packages 35 and the lead frame 12 along dicing lines 38. At this time, the sheet 36 is cut only partially, and thereby the individual resin packages 2 divided into pieces are supported on the sheet 36. Meanwhile, in this embodiment, the hatched regions of the leads 4 shown in Part (A) of FIG. 2 are arranged on the dicing lines 38. The leads 4 are cut in recessed regions by the dicing blade 37, and thereby the burden of the dicing blade 37 is reduced, so that long time use thereof is enabled.

Note that in this embodiment, the temperature of the blown inert gas is not particularly limited, but, for example, a case may be employed in which the inert gas is heated and then is blown into the opening region 26. In this case, the copper wire 31 is difficult to cool due to the inert gas, and the current efficiency in forming the initial ball can be enhanced.

In addition, the description has been given of the case in which the work is performed in the wire bonding while the top portion of the opening region 26 of the clamper 24 is not covered with a lid member such as a plate, but the embodiment is not limited to this case. For example, a case may be employed in which the top portion of the opening region 26 is covered with a lid member having an opening only above the work region, and in which the lid member slides according to the work region. In this case, the top portion of the opening region 26 is mostly covered with the lid member, and thereby the inside of the opening region 26 can be easily filled with the inert gas. Thus, an amount of supplying the inert gas is reduced, so that an effect of reducing the manufacturing cost can also be obtained.

Meanwhile, the description has been given of the case in which the individual leads 4 are fixed in the lead fixing regions 27 of the clamper 24, respectively, but the embodiment is not limited to this case. For example, when individual leads can be firmly fixed according to the lead arrangement state such as a lead shape or a lead height, a case may be employed in which the leads are divided into groups of multiple adjacent leads and are fixed in the lead fixing regions. In this case, the number of the lead fixing regions is smaller than the total number of the leads, but a method of blowing the inert gas is the same as the method of blowing the inert gas through between the lead fixing regions as described. In addition, various modifications can be made without departing from the gist of the invention.

Figure 9A:
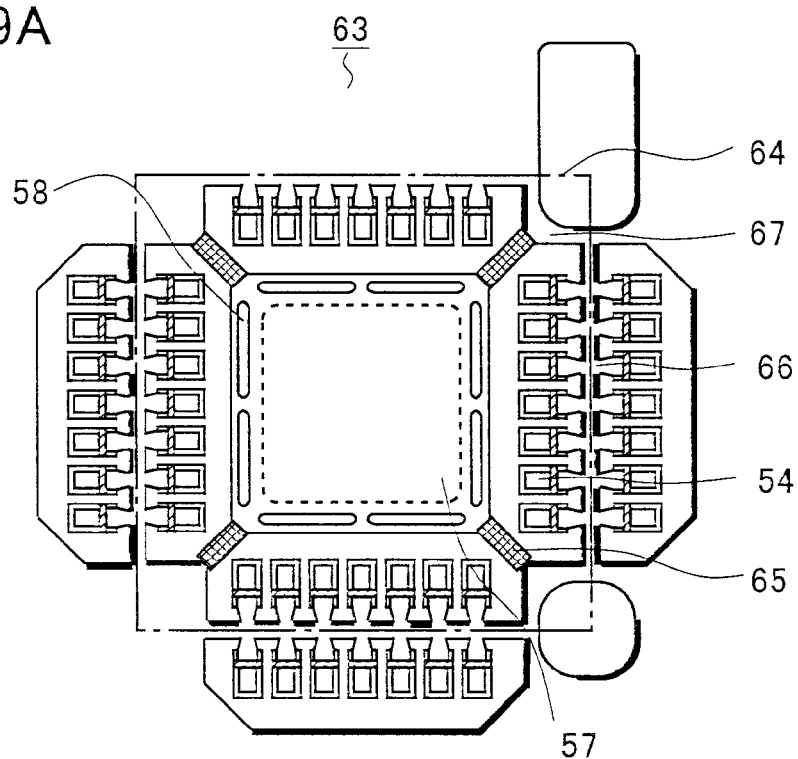
FIG. 9 is a view for describing the semiconductor device according to the other embodiment of the invention, Part (A) is a plan view and Part (B) is a plan view.
Figure 9B:
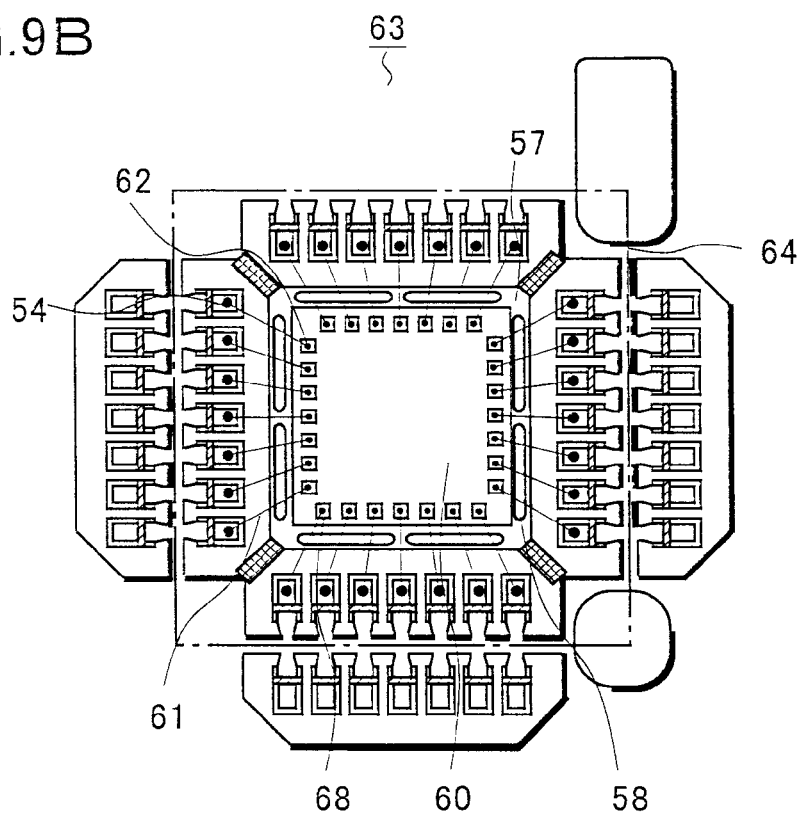
Figure 10A:
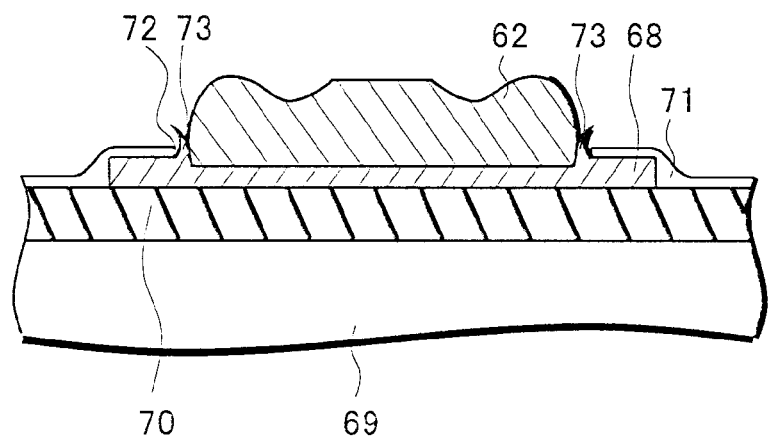
FIG. 10 is a view for describing the semiconductor device according to the other embodiment of the invention, Part (A) is a cross-sectional view and Part (B) is a cross-sectional view.
Figure 10B:
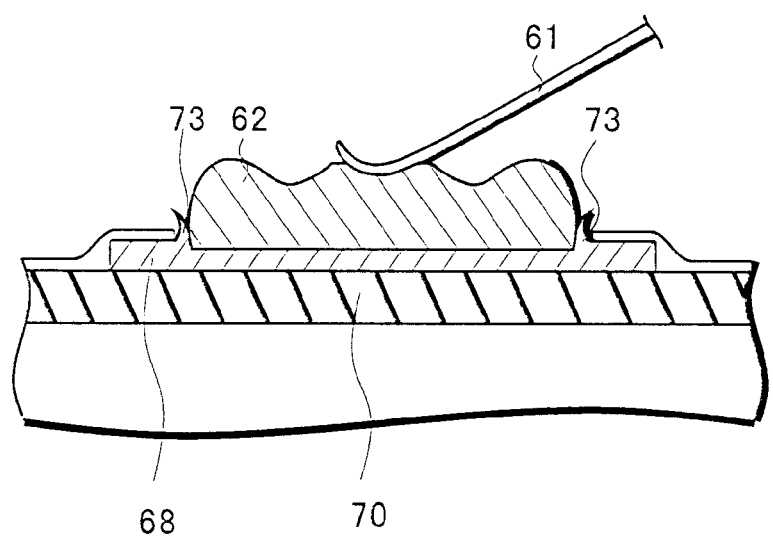
Figure 11A:
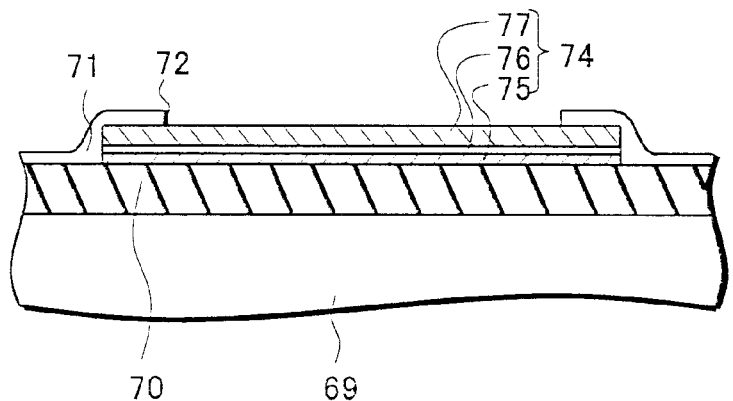
FIG. 11 is a view for describing the semiconductor device according to the other embodiment of the invention, Part (A) is a cross-sectional view and Part (B) is a cross-sectional view.
Figure 11B:
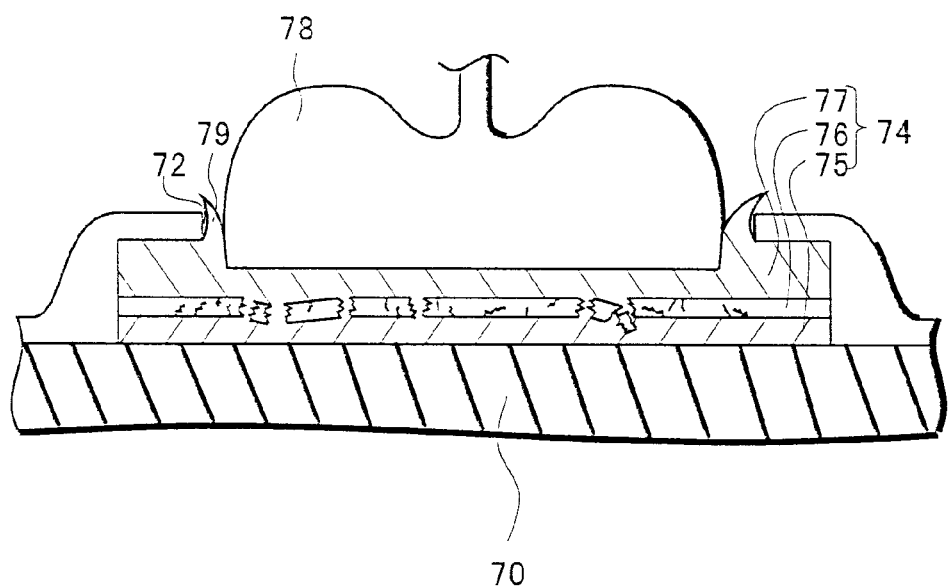

Hereinbelow, a description is given of a semiconductor device according to another embodiment of the invention. Parts (A), (B), (D), and (E) of FIG. 8 are perspective views for explaining a resin package. Part (C) of FIG. 8 is a cross-sectional view for explaining the resin package. Part (A) of FIG. 9 is a plan view for explaining a lead frame. Part (B) of FIG. 9 is a plan view showing a state after wire bonding is performed on the lead frame. Parts (A) and (B) of FIG. 10 are cross-sectional views for explaining a connection state of an electrode pad. Parts (A) and (B) of FIG. 11 are cross-sectional views for explaining a connection state of the electrode pad.

As shown in Part (A) of FIG. 8, a semiconductor device 51 includes a resin package 52 based on the MAP, for example. As described later by using FIG. 16, group blocks are collectively encapsulated and then divided into individual pieces by dicing, and thus leads 54 are exposed from side surfaces 53 of the resin package 52. The exposed leads 54 form surfaces flush with the side surfaces 53 of the resin package 52. Note that the exposed state of the leads 54 is not limited to a shape illustrated therein. For example, as shown in Part (D) of FIG. 8, a case may be employed in which an exposed surface of each lead 54 has a T-shape for preventing the wear of a dicing blade. Alternatively, as shown in Part (E) of FIG. 8, a case may be employed in which a dicing region on the back side of the lead 54 is half-etched, and an exposed surface of the lead 54 is spaced away from side edges 55 of the resin package 52 and located closer to a front surface of the resin package 52.

As shown in Part (B) of FIG. 8, an island 57 is exposed from a back surface of the resin package 52, and the island 57 forms a surface approximately flush with a back surface 56 of the resin package 52. Multiple through-holes 58 are formed in a periphery region in the island 57. The through-holes 58 are filled with an insulating resin to form the resin package 52. Each lead 54 is exposed from the back surface 56 of the resin package 52 and is arranged in such a manner as to surround the island 57.

Part (C) of FIG. 8 is a cross-sectional view of the semiconductor device taken in a direction of the B-B line in Part (B) of FIG. 8 and shows a cross section including the through-holes 58 formed in the island 57. As illustrated therein, a semiconductor element 60 is fixedly attached to the island 57 with an adhesive 59, for example, a Ag paste, solder or the like. Multiple electrode pads 68 (see Part (B) of FIG. 9) are formed on an upper surface of the semiconductor element 60, and a gold ball 62 is formed on an upper surface of each of the electrode pads 68. Then, the gold ball 62 and an inner lead portion of the lead 54 are connected with each other with a copper wire 61 which is a subject of the present application. A copper wire 61 having a diameter of, for example, 33 μm to 50 μm and made of 99.9 wt % to 99.99 wt % of copper is used. Then, as illustrated therein, the copper wire 61 is ball-bonded to the lead 54 and stitch-bonded to the gold ball 62 of the electrode pad 68. Note that any design change can be made to the diameter of the copper wire 61 according to the usage.

The island 57 is formed by a frame mainly made of copper having a thickness of, for example, about 100 μm to 250 μm. The island 57 includes the multiple through-holes 58 formed therein. As described in detail later, the through-holes 58 are utilized as flowing passages of the inert gas (forming gas) at the time of die bonding or wire bonding, and thus are arranged in a peripheral region of a fixing region of the semiconductor element 60. Each through-hole 58 is buried with the insulating resin in resin molding. With this structure, a region of adhesion between the resin package 52 and the island 57 is increased, and the resin enters in the island 57, so that the island 57 is securely supported in the resin package 52. Further, the serving of the through-hole 58 as a passage of the inert gas prevents oxidization of side surfaces of the through-hole 58. In addition, the adherence between the island 57 and the resin package 52 is enhanced.

For example, in the resin package 52, low molecular components contained in the resin package 52 and the adhesive 59 evaporate due to driving heat or the like in the semiconductor element 60, so that a gas is generated. Due to the aforementioned gas, the island 57 receives an external force in a direction of being extruded from the resin package 52. In particular, the island 57 has a small thickness of 100 μm to 250 μm, and the adherence between the island 57 and the resin package 52 is weak. Thus, the island 57 is easily extruded from the resin package 52 due to the gas. However, arranging the through-holes 58 in the periphery region of the island 57 enhances the adherence between the resin package 52 and the island 57, thus leading to a structure in which the island 57 does not easily come off the resin package 52.

Further, the through-holes 58 are also utilized as the exhaust passages of the aforementioned gas generated around the island 57. The gas is exhausted to the outside of the resin package 52 through each through-hole 58 in a short path, and thereby the island 57 is difficult to extrude to the outside of the resin package 52 due to the gas.

Figure 13A:
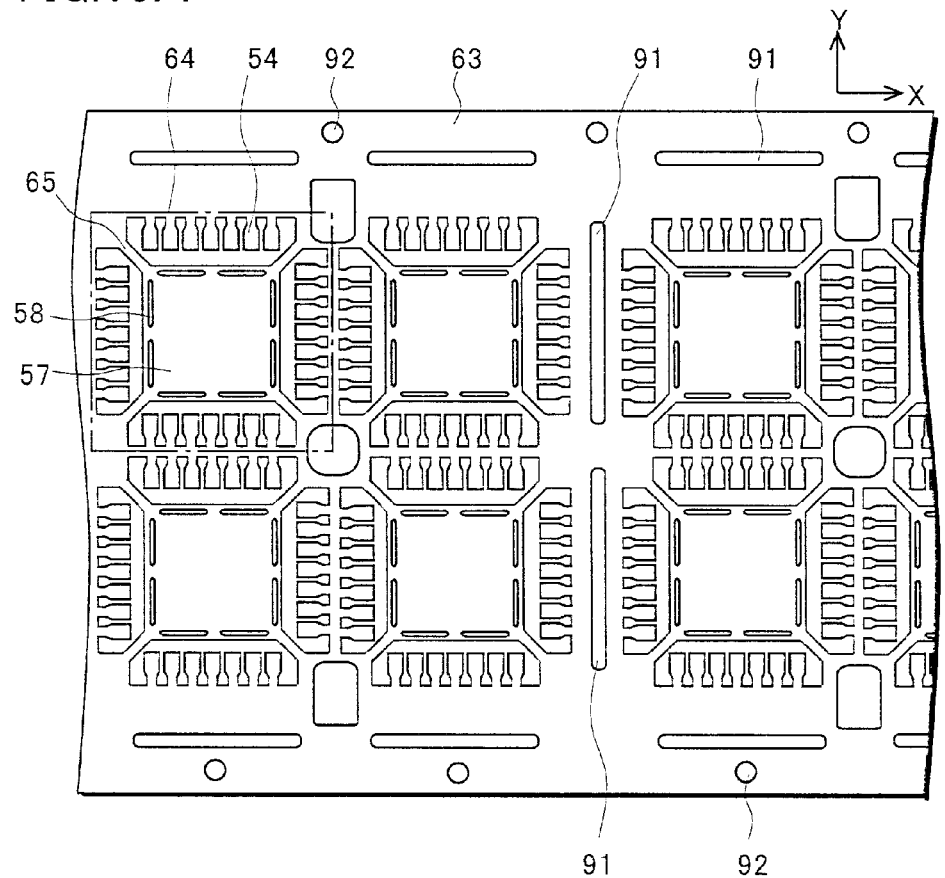
FIG. 13 is a plan view for describing the semiconductor device manufacturing method according to another embodiment of the invention.
Figure 13B:
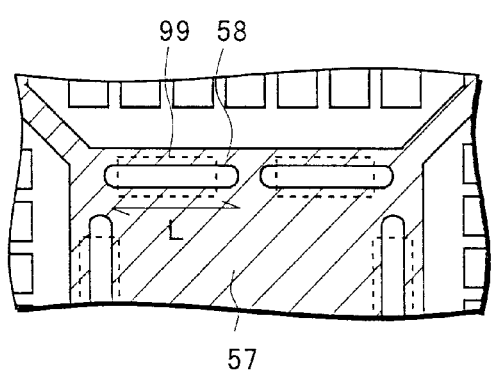

As shown in Part (A) of FIG. 9, a frame mainly made of copper is generally used as a lead frame 63. However, a case may be employed in which a frame is mainly made of Fe—Ni, and another case may be employed in which the frame is mainly made of a different metal material. The lead frame 63 made of such a material has multiple mounting portions 64 formed thereon shown by a dashed-dotted line. Note that the figure shows one of the mounting portions 64, but as shown in FIG. 13, the four mounting portions 64, for example, are grouped to form one group block. Then, resin molding is performed collectively on each group block.

The mounting portion 64 mainly includes the island 57, support leads 65 supporting the island 57, the leads 54 located near four sides of the island 57, and tie bars 66 each supporting the corresponding ones of the leads 54. The support leads 65 extend from four corners of the island 57, respectively, and are coupled to supporting regions 67 at which the tie bars 66 cross each other. The supporting regions 67 are integral with the lead frame 63, and thus the island 57 is supported by the lead frame 63.

A region indicated by a dotted line in the island 57 is the fixing region for the semiconductor element 60, and thus the through-holes 58 are arranged in locations such that the fixing region is surrounded. For example, two of the through-holes 58 are arranged along each side of the island 57. Each through-hole 58 has a length which is approximately half the length of the island 57. Although the details will be described later by using Part (B) of FIG. 14, the increased area of an opening of the through-hole 58 makes it possible to easily dispose gas exhaust holes 99 below the through-holes 58 in placing the lead frame 63 on a placement stage even though the lead frame 63 is slightly displaced. Thus, a suction force of the inert gas can be appropriately maintained. Furthermore, a region of adhesion with the insulating resin filling the through-hole 58 is increased, and the aforementioned adherence with the resin package 52 is enhanced. Note that the shape of the through-hole 58 is not limited to the illustrated shape. A case may be employed in which the shape of the through-hole 58 is, for example, a circle, an ellipse or a rectangle. What is necessary is that the through-hole 58 has a width equal to or larger than an interval between adjacent ones of the leads 54.

Note that hatched regions of the support leads 65 are etched by approximately 0.05 μm to 0.15 μm from the back surface side of the lead frame 63, and thus are recessed regions. Then, the resin is filled into the recessed regions of the support leads 65, and the support leads 65 are supported in the resin package 52, so that an anchor effect is obtained.

Meanwhile, due to the aforementioned gas generated in the resin package 52 and the adhesive 59, the island 57 might receive the external force of extruding the island 57 from the resin package 52. For this case, the structure has been employed in which the island 57 is supported in the resin package 52 by the support leads 65, and in which the island 57 does not easily come off the resin package 52. Note that as shown in Part (B) of FIG. 8, there is a structure in which the support leads 65 are not exposed from the back surface 56 of the resin package 52.

As shown in Part (B) of FIG. 9, the semiconductor element 60 is fixedly attached to the island 57, and the gold ball 62 is formed on the upper surface of the electrode pad 68. The copper wire 61 is ball-bonded to an upper surface of the lead 54 and then stitch-bonded to an upper surface of the gold ball 62. Here, it is necessary to prevent oxidization of the copper wire 61 and a connection portion between the copper wire 61 and the gold ball 62, and the like. As described later by using Part (B) of FIG. 14, when the structure in which the inert gas is exhausted through the through-hole 58 is provided, the inert gas flows from above to a bonding region, a region in which the copper wire 61 is arranged is easily filled with the inert gas at any time, and the presence of the inert gas prevents oxidization of the copper wire 61. Consequently, the copper wire 61 can be used instead of a gold wire, and the cost can be considerably reduced.

Meanwhile, suppose a case of a semiconductor element in which a large current is handled. In this case, when gold wires are used, multiple gold wires are used for a single electrode pad to handle the large current. In contrast, copper wires have a smaller specific resistance and a larger current capacity, and thus the large current can be handled with a smaller number of copper wires than the gold wires. Consequently, the area of the bonding regions can be made smaller than in the case of the gold wires, and thus miniatualization of a semiconductor element can be achieved.

As shown in Part (A) of FIG. 10, an insulating layer 70 of, for example, a silicon oxide film, a BPSG (boron phospho silicate glass) film, a TEOS (tetra-ethyl-orso-silicate) film, a SOG (spin on glass) film, or the like is formed on a silicon substrate 69. The electrode pad 68 is formed on the insulating layer 70. The electrode pad 68 has a film thickness of, for example, 0.4 μm to 3.0 μm. The electrode pad 68 is formed by, for example, an aluminium layer or an alloy layer mainly based on aluminium. The alloy layer is, for example, an aluminium-silicon film, an aluminium-silicon-copper film, an aluminium-copper film, or the like. A shield layer 71 formed by, for example, a silicon nitride film is formed on the insulating layer 70. An opening portion 72 is formed in the shield layer 71 on the electrode pad 68. Note that the aforementioned alloy layer is mainly based on aluminium, and silicon, copper, or the like is arranged approximately evenly in the aluminium.

The gold ball 62 is ball-bonded to the electrode pad 68 exposed from the opening portion 72. The gold ball 62 slightly eats into the electrode pad 68 due to the load in the ball bonding, and thus a splash 73 might be formed to some degree around the gold ball 62. However, since the gold ball 62 is softer than a copper ball and smaller load is applied thereto in bonding than to the copper ball, the degree of the splash 73 is such that the splash 73 is formed between a side surface of the opening portion 72 and the gold ball 62. The splash 73 is not formed beyond a region in which the electrode pad 68 is formed. With this structure, adjacent ones of the electrode pads 68 can be prevented from being short-circuited due to contact of the splash 73 thereof. Note that a case may be employed in which the gold ball 62 is connected with the electrode pad 68 only by the thermal compression technique not in combination with the ultrasonic vibration technique. In this case, the aforementioned formation of the splash 73 can be prevented to the maximum extent. Alternatively, the size of the gold ball 62 may be made smaller to adjust the bonding load. Thus, the aforementioned formation of the splash 73 can be prevented to the maximum extent.

Further, by reducing the formation of the splash 73 as described above, the electrode pad 68 remains adequately between a bottom surface of the gold ball 62 and the insulating layer 70. With this structure, the gold ball 62 is in a state in which the bottom surface thereof is securely connected with the electrode pad 68, and thus it is possible to prevent increase of a connection resistance value in the electrode pad 68. It is also possible to prevent a connection failure in the electrode pad 68.

As shown in Part (B) of FIG. 10, the copper wire 61 is stitch-bonded to the gold ball 62. As described above, since the gold ball 62 has a wide region of connection with the electrode pad 68, the load on the copper wire 61 in bonding is dispersed by the gold ball 62. In other words, the gold ball 62 is utilized as a buffer and thus prevents damage such as a crack made to the insulating layer 70 below the electrode pad 68 due to an impact in the bonding. In addition, the dispersion of the bonding load prevents a considerable increase of the splash 73. The degree of the splash 73 is slightly larger than that of the splash 73 formed at the time of connection of the gold ball 62 shown in Part (A) of FIG. 10, if any. Thus, adjacent ones of the electrode pads 68 are also prevented from being short-circuited due to the splash 73 thereof.

Moreover, by stitch-bonding the copper wire 61 onto the gold ball 62, the height from the semiconductor element 60 is limited, and thus the resin package 52 is made thin. Meanwhile, although not illustrated, by ball-bonding the copper wire 61 onto the lead 54, the area of connection with the lead 54 becomes larger than that in stitch bonding. Thereby, even if the lead 54 is made thinner, the lead 54 is prevented from being bent easily due to an impact at the time of bonding, and thus the resin package 52 can further be made thinner.

Note that a case may be employed in which the copper wire 61 is stitch-bonded to the gold ball 62 and the lead 54. Alternatively, a case may be employed in which the copper wire 61 is ball-bonded to the gold ball 62 and stitch-bonded to the lead 54. Also in these cases, the short circuit due to the splash 73 is prevented as described above, and damage to the insulating layer 70 is prevented as well.

Figure 12A:
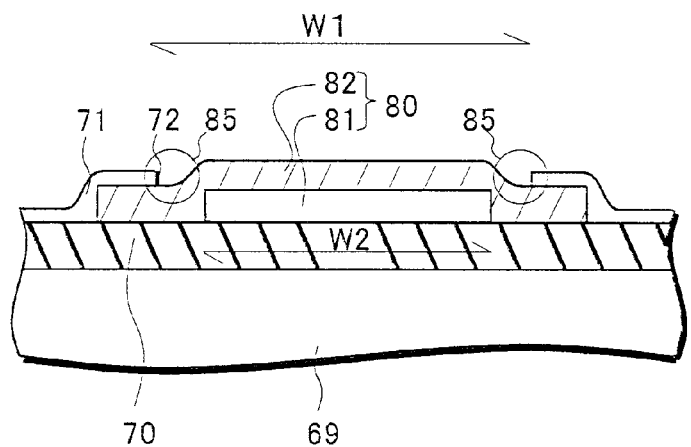
FIG. 12 is a view for describing a semiconductor device manufacturing method according to another embodiment of the invention, Part (A) is a cross-sectional view and Part (B) is a cross-sectional view.
Figure 12B:
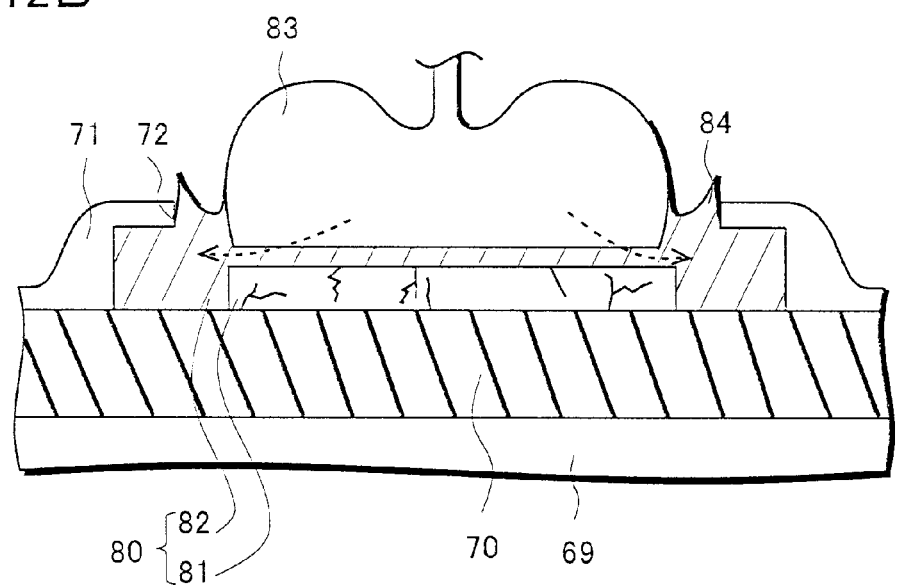

Next, in FIGS. 11 and 12, the aforementioned problem of the short circuit due to the splash and the problem of a crack in the insulating layer are coped with by using a structure of the electrode pad without using the gold ball 62 (see FIG. 10). Note that in the following description, the same components as the components of the semiconductor device described by using FIG. 10 are denoted by the same reference numerals.

As shown in Part (A) of FIG. 11, an electrode pad 74 has a structure in which a buffer layer 76 is disposed between aluminium layers 75 and 77. For example, the aluminium layer 75 has a film thickness of approximately 0.4 μm, the buffer layer 76 has a film thickness of approximately 0.1 μm, the aluminium layer 77 has a film thickness of approximately 2.9 μm, and thus the electrode pad 74 has a film thickness of approximately 3.4 μm. The buffer layer 76 has a film quality harder than those of the aluminium layers 75 and 77 and is formed by a refractory metal layer of, for example, a titanium-nitride (TiN) layer, a titanium-tungsten (TiW) layer, or the like. Note that a case may be employed in which alloy layers mainly based on aluminium are disposed on upper and lower surfaces of the buffer layer 76 as described above.

As shown in Part (B) of FIG. 11, a copper ball 78 is ball-bonded to the electrode pad 74 exposed from the opening portion 72 of the shield layer 71. The copper ball 78 slightly eats into the electrode pad 74 due to the load at the time of the ball bonding, and thus a splash 79 is formed around the copper ball 78.

As described above, a three-layer structure for the electrode pad 74 is employed, and thereby the film thickness of the aluminium layer 77 can be made thinner, although the film thickness of the electrode pad 74 itself is the same as that in a conventional one. As the result, an amount of part of the electrode pad 74 forcedly moving around the copper ball 78 due to the bonding load is reduced, and the splash 79 itself becomes small. With this structure, adjacent ones of the electrode pads 74 can be prevented from being short-circuited due to contact of the splash 79 thereof. Meanwhile, disposing the buffer layer 76 on the aluminium layer 75 leads to a structure in which the electrode pad 74 is difficult to forcedly move around the copper ball 78 at the time of bonding. Consequently, an aluminium layer 75 reliably exists on a bottom surface of the copper ball 78, and thus a connection failure on the electrode pad 74 is prevented.

Moreover, the buffer layer 76 is disposed between the aluminium layers 75 and 77, and thereby the bonding load is reduced by the buffer layer 76, so that it is possible to prevent damage such as a crack from being made to the insulating layer 70 below the electrode pad 74. Furthermore, the buffer layer 76 is broken due to the bonding load, and thereby the aluminium layers 75 and 77 are directly connected with each other in the broken region. Then, a current flows actively in the low-resistance region, an increase of a connection resistance value in the electrode pad 74 can be reduced. Note that as described above, the buffer layer 76 is formed by a low-specific-resistance metal layer, and thereby there is no considerable increase of the connection resistance value even though the buffer layer 76 is not broken.

As shown in Part (A) of FIG. 12, an electrode pad 80 is formed in the following manner. A buffer layer 81 is formed on an upper surface of the insulating layer 70, and an aluminium layer 82 is disposed in such a manner as to cover the buffer layer 81. The buffer layer 81 is disposed inside the opening portion 72 of the shield layer 71 and has a width W2 which is smaller than a width W1 of the opening portion 72. The shape of the buffer layer 81 is a shape obtained by analogously making the shape of the opening portion 72 smaller. The buffer layer 81 has a film thickness of, for example, 0.5 μm to 1.0 μm, and the aluminium layer 82 has a film thickness of, for example, 0.4 μm to 3.0 μm. With this structure, a laminated region formed by the buffer layer 81 and the aluminium layer 82 is a region protruding from the other regions in the electrode pad 80. Note that the material of the buffer layer 81 is the same as that of the buffer layer 76, and any design change can be made to the material of the buffer layer 81 as long as the buffer layer 81 is disposed within the opening portion 72. In addition, what is necessary is to form the aforementioned protruding region in the electrode pad 80. Alternatively, a case may be employed in which the buffer layer 81 is disposed in the aluminium layer 82 similarly to the structure in FIG. 11.

As shown in Part (B) of FIG. 12, a copper ball 83 is ball-bonded to the electrode pad 80 exposed from the opening portion 72 of the shield layer 71. The copper ball 83 slightly eats into the electrode pad 80 due to the load at the time of the ball bonding, and a splash 84 is formed around the copper ball 83.

When the copper ball 83 is ball-bonded to the protruding region of the electrode pad 80, the aluminium layer 82 in the protruding region thereby forcedly moves toward a side surface of the opening portion 72 as shown by the dotted arrows. At this time, the forcedly moving aluminium layer 82 firstly moves to a recessed region 85 (see Part (A) of FIG. 12) around the protruding region and buries the recessed region 85. Part, of the aluminium layer 82, overflowing from the recessed region 85 turns into the splash 84, and thus the splash 84 itself is small. With this structure, adjacent ones of the electrode pads 80 can be prevented from being short-circuited due to contact of the splash 84 thereof.

Moreover, the buffer layer 81 is disposed in the region onto which the copper ball 83 is ball-bonded, and thereby the bonding load is reduced by the buffer layer 81, so that it is possible to prevent damage such as a crack from being made to the insulating layer 70 below the electrode pad 80. Note that even though a crack or the like occurs in the buffer layer 81 due to the bonding load, there is no particular problem.

Note that the description has been given of the case where the multiple through-holes 58 are formed in the island 57, where the flow of the inert gas is adjusted through the through-holes 58, and where oxidization of the copper wire 61 and the connection region thereof is thereby prevented, but the embodiment is not limited to the case. For example, a case may be employed in which the through-holes 58 are not arranged in the island 57 or in which gaps between the island 57 and the leads 54 or gaps between the leads 54 are utilized to adjust the aforementioned flow of the inert gas. Alternatively, a case may be employed in which the through-holes 58 and the aforementioned gaps are utilized in combination with each other to adjust the aforementioned flow of the inert gas.

In addition, although the description has been given of the resin package 52 based on the MAP, the embodiment is not limited to the package. For example, also in an individual-molding-type package like a package based on a QFP (quad flat package) method, a package based on a QFN (quad flat non-leaded package) method, or the like, an effect similar to the one described above can be obtained. In addition, various modifications can be made without departing from the gist of the invention.

Figure 14A:
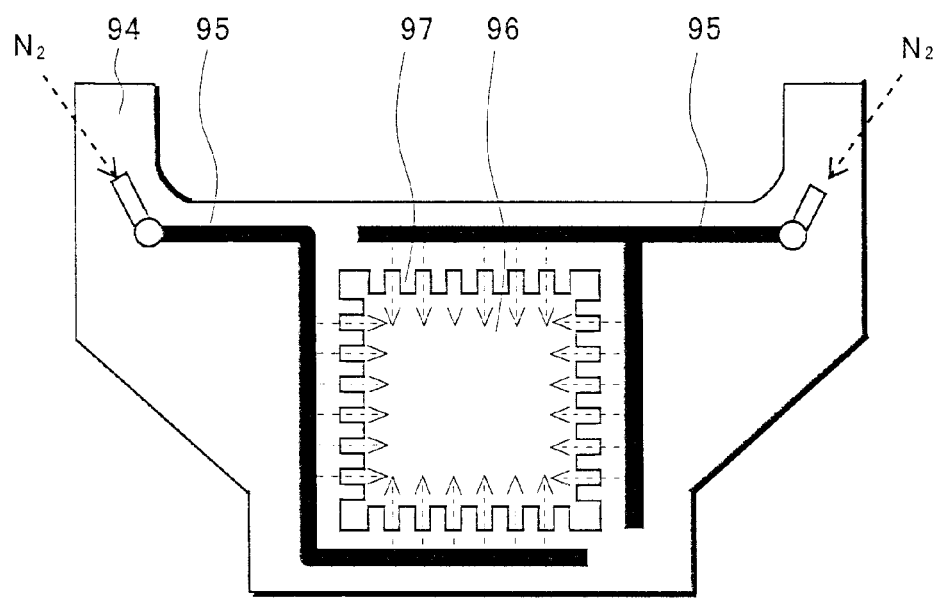
FIG. 14 is a view for describing a semiconductor device manufacturing method according to the other embodiment of the invention, Part (A) is a plan view and Part (B) is a cross-sectional view.
Figure 14B:
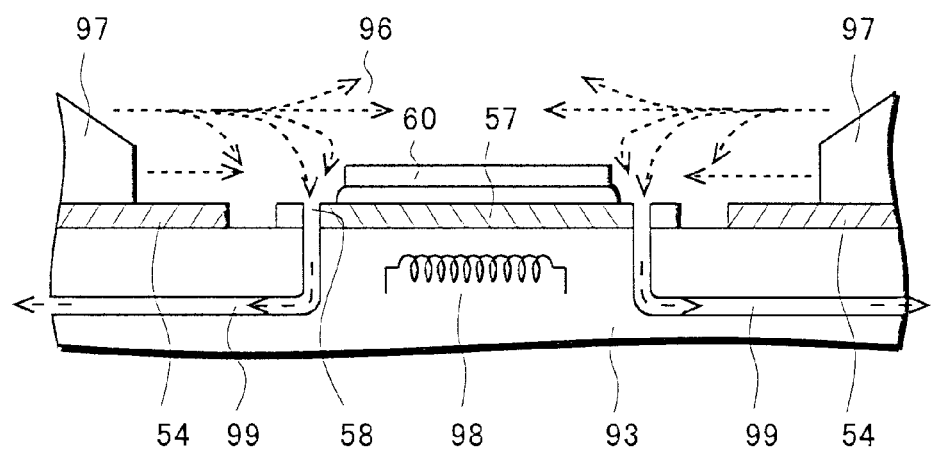
Figure 15A:
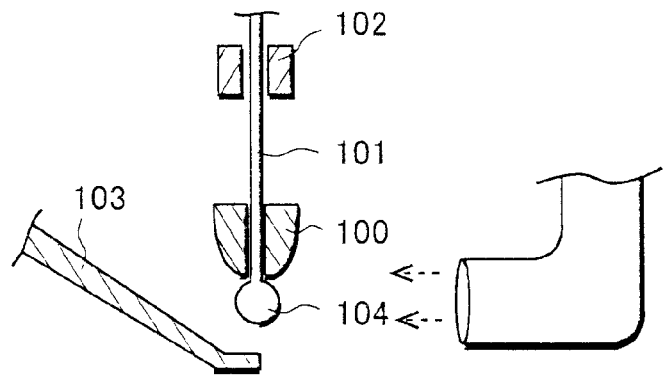
FIG. 15 is a view for describing a semiconductor device manufacturing method according to the other embodiment of the invention, Part (A) is a cross-sectional view, Part (B) is a cross-sectional view, and Part (C) is a cross-sectional view.
Figure 15B:
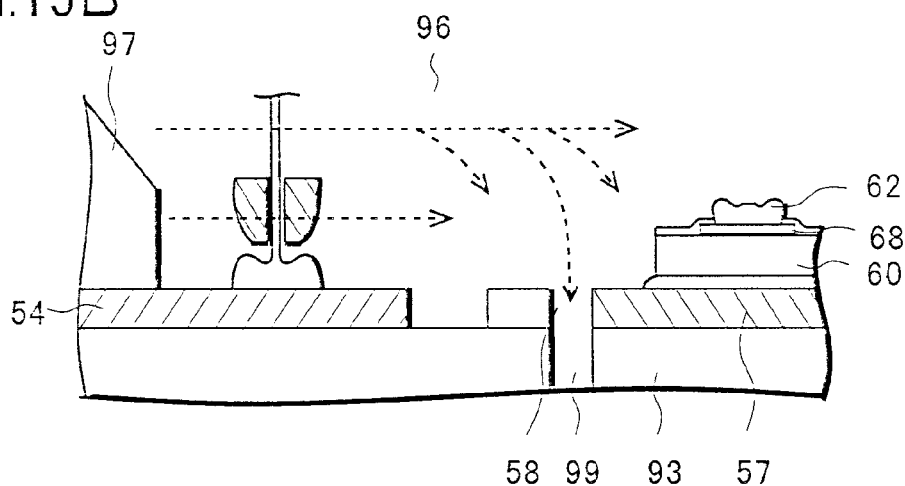
Figure 15C:
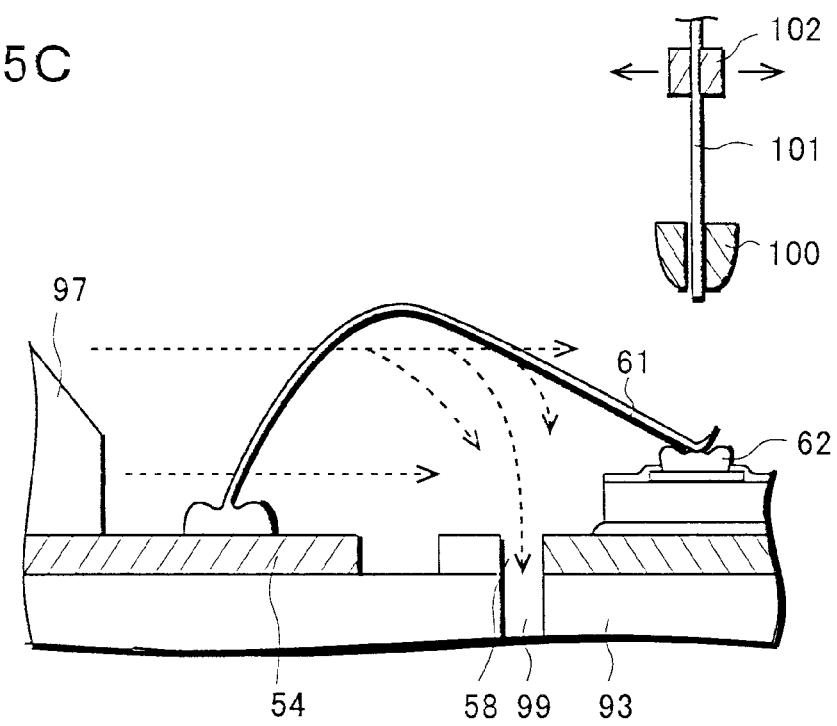
Figure 16A:
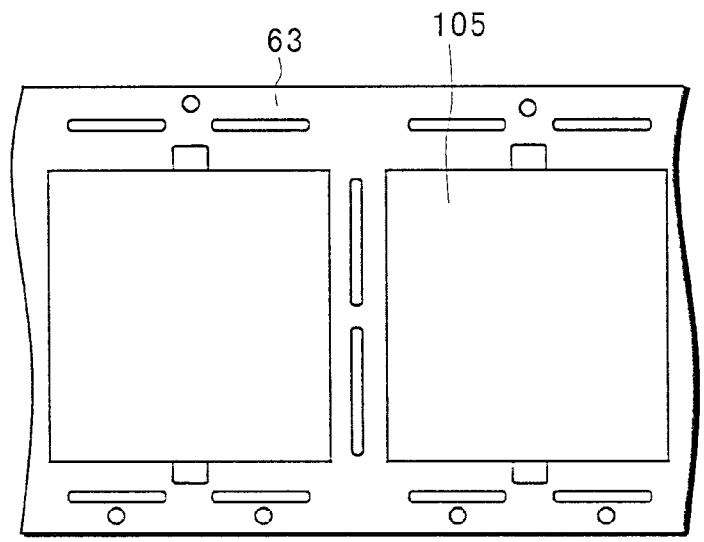
FIG. 16 is a view for describing the semiconductor device manufacturing method according to the other embodiment of the invention, Part (A) is a plan view and Part (B) is a cross-sectional view.
Figure 16B:
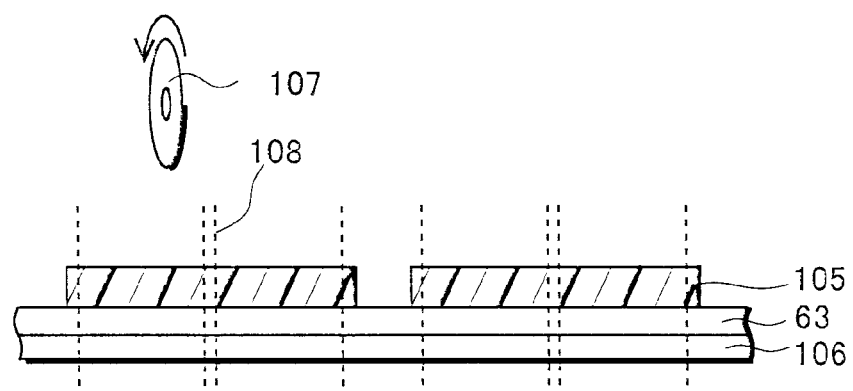
Figure 17A:
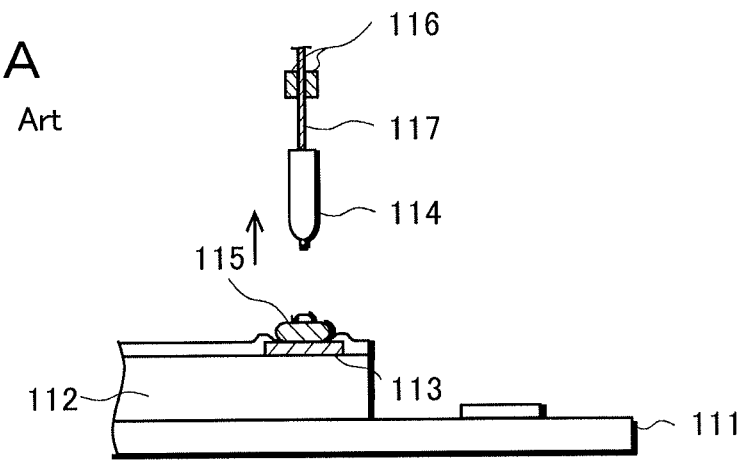
FIG. 17 is a view for describing a semiconductor device manufacturing method according to a conventional embodiment, Part (A) is a cross-sectional view, Part (B) is a cross-sectional view, and Part (C) is a cross-sectional view.
Figure 17B:
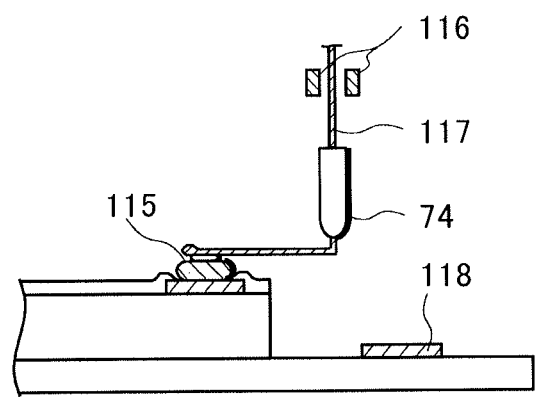
Figure 17C:
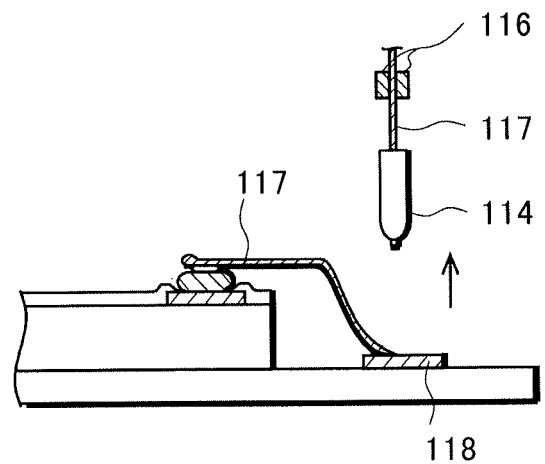

Next, a description is given of a semiconductor manufacturing method according to another embodiment of the invention. Parts (A) and (B) of FIG. 13 are plan views for explaining a lead frame. Part (A) of FIG. 14 is a plan view for explaining a clamper. Part (B) of FIG. 14 is a cross-sectional view for explaining a flow of an inert gas at the time of wire bonding. Parts (A) to (C) of FIG. 15 are cross-sectional views for a wire bonding step. Part (A) of FIG. 16 is a plan view for explaining a resin molding step. Part (B) of FIG. 16 is a cross-sectional view for explaining a dicing step. It should be noted that in the following description, the same components of the semiconductor device as those described by using FIG. 8 to FIG. 10 are denoted by the same reference numerals. In the description of the manufacturing method in this embodiment, FIG. 8 to FIG. 10 are used as appropriate for the description.

Firstly, as shown in Part (A) of FIG. 13, a lead frame 63 mainly made of, for example, copper is prepared. Multiple mounting portions 64 are formed at the lead frame 63 as shown by a dashed-dotted line. The lead frame 63 is divided into sections at regular intervals in a longitudinal direction (an X axis direction in the drawing) based on slits 91. In each of the sections divided based on the slits 91, a single group block formed by grouping, for example, the four mounting portions 64 is formed. Multiple group blocks are formed along the longitudinal direction of the lead frame 63. Also in the longitudinal direction of the lead frame 63, index holes 92 are provided at regular intervals in each of upper and lower edge regions of the lead frame 63, which are used for positioning in the steps mentioned above. Note that the detailed structure of each mounting portion 64 has been described with reference o Part (A) of FIG. 9.

As described later by using Part (B) of FIG. 14, regions shown by dotted lines in Part (B) of FIG. 13 correspond to regions in which gas exhaust holes 99 are arranged in a placement stage 93. For example, one of through-holes 58 is arranged above one of the gas exhaust holes 99. Each through-hole 58 has a large length L. Thereby, even though the lead frame 63 is slightly displaced in placing the lead frame 63 on the placement stage 93, an inert gas can be reliably sucked through the through-hole 58. Note that the inert gas flow is directed toward the placement stage 93, and a copper wire 61, the connection portion with the copper wire 61, and the like are arranged in the flow, so that oxidization thereof is prevented. Accordingly, the each gas exhaust hole 99 may be larger than the through-hole 58. For example, a case may be employed in which the inert gas is exhausted by utilizing spaces between an island 57 and the leads 54 and spaces between the leads 54.

Next, as shown in Part (B) of FIG. 9, a semiconductor element 60 is fixedly attached to each mounting portion 64 of the lead frame 63 by using an adhesive 59 on the island 57 (see Part (C) of FIG. 8). In this step, the lead frame 63 is placed on a placement stage of a die bonding apparatus having a heating mechanism incorporated therein, and a clamper fixes the lead frame 63 on the placement stage. Then, in a state where the island 57 of the lead frame 63 and the inside of a work region thereof is heated at, for example, approximately 250° C. to 260° C., the semiconductor element 60 is fixedly attached to the island 57. The work is repeated, thus being performed on the multiple islands 57. Although the details of a flow of the inert gas in the wire bonding step is the same as those of the flow to be described with reference to Part (B) of FIG. 14, the inert gas is made flow into the work region of the lead frame 63 from the clamper for fixing the lead frame 63. Then, the inert gas is exhausted toward a placement stage through the through-hole 58 of the island 57, and thereby space around the lead frame 63 is filled with the inert gas. As the result, although the lead frame 63 is placed under the high-temperature condition for a long time, oxidization thereof is prevented.

Next, the lead frame 63 is placed on the placement stage 93 of a wire bonding apparatus, and the wire bonding is performed on each mounting portion 64 of the lead frame 63.

First of all, a description is given of a clamper 94 shown in Part (A) of FIG. 14. The clamper 94 includes pipes 95 through which the inert gas is fed and an opening region 96 opened in accordance with the size of the mounting portion 64. The inert gas blown through the pipes 95 of the clamper 94 blows into the opening region 96, passing through between lead fixing regions 97. When the copper wire 61 has a diameter of 45 μm, a nitrogen gas (containing a little hydrogen gas) of, for example, 1.9 liters per minute is used. Although the copper wire 61 is placed in the work region under the high-temperature condition and thus is in a state where oxidization of the copper wire 61 can easily occur, the oxidization thereof is prevented due to the presence of the aforementioned inert gas.

Further, in the clamper 94 around the opening region 96, the multiple lead fixing regions 97 are arranged in a comb shape in accordance with the shape of the leads 54 in the mounting portion 64. The leads 54 are individually fixed on the placement stage 93 (see Part (B) of FIG. 14) by using the lead fixing regions 97. Meanwhile, the copper wire 61 is harder but more ductile than the gold wire. Thus, the load (load applied from a capillary 100 (see Part (A) of FIG. 15) at the time of the ball bonding is made higher than that applied to the gold wire. The multiple leads 54 are individually fixed by using the lead fixing regions 97 of the clamper 94 which correspond to the shapes of the respective leads 54, and thereby the loss of the load at the bonding is prevented. Thus, the copper wire 61 is reliably attached to the lead 54, so that a connection failure is prevented.

Next, a description is given of the flow of the inert gas shown in Part (B) of FIG. 14. The placement stage 93 having a heating mechanism 98 includes the gas exhaust holes 99 formed therein. The lead frame 63 is placed on the placement stage 93 in such a manner that the through-holes 58 of the island 57 are located above the gas exhaust holes 99. As shown in the dotted arrows, the inert gas is blown through between the lead fixing regions 97 of the clamper 94 toward the center of the opening region 96 (the mounting portion). In other words, the inert gas is blown into the opening region 96 from the entire periphery thereof toward the center. The opening region 96 is not covered. If the inside of the opening region 96 is in the high-temperature condition, the inert gas is released to above the opening region 96 due to an ascending air current. Hence, in this embodiment, the inert gas is sucked from the gas exhaust holes 99 in the placement stage 93 through the through-holes 58, so that the inert gas blown from above the leads 54 flows mainly toward the through-holes 58 of the island 57. As the result, the inert gas flows mainly to below the opening region 96 (toward the placement stage 93), and a region in which the copper wire 61 is arranged becomes a region to be readily filled with the inert gas.

The temperature in the work region which is in the opening region 96 of the clamper 94 is maintained at, for example, 250° C. to 260° C. by the heating mechanism 98. Wire-bonded ones of the copper wires 61 are left in the work region in the high-temperature condition until wire bonding of all the electrodes of the semiconductor element 60 is completed (for example, until wire bonding of all the semiconductor elements 60 in one group block is completed). Hence, the aforementioned flow of the inert gas is generated, and thereby the space around the copper wires 61 is easily filled with the inert gas, so that the copper wires 61 are efficiently prevented from being oxidized. Although the lead frame 63 including the leads 54 and the like is also in the state where oxidization easily occurs, the flowing of the inert gas toward the placement stage 93 efficiently prevents the lead frame 63 as well from being oxidized.

Note that the embodiment is not limited to the case in which the inert gas is blown through between the lead fixing regions 97, and a case may be employed in which the inert gas is blown into the opening region 96 by utilizing a gas nozzle, for example. In addition, not all of the inert gas blown into the opening region 96 is sucked from the gas exhaust holes 99 in the placement stage 93, and some of the inert gas flows to above the opening region 96. Then, the opening region 96 and the vicinity thereof become a region filled with the inert gas.

Next, as shown in Part (A) of FIG. 15, a copper wire 101 is inserted into a center hole of the capillary 100, and a wire clamper 102 for holding the copper wire 101 is arranged above the capillary 100. The copper wire 101 in any desired length is drawn in advance from a tip end of the capillary 100, electricity is discharged from a torch 103 located near the capillary, and an initial ball (a copper ball) 104 is formed at the tip end of the capillary 100. Note that, as illustrated therein, the aforementioned inert gas is supplied to a work region in which the initial ball 104 is formed. For this reason, a redox behavior due to hydrogen contained in the inert gas causes a spherical shape of the initial ball 104 to be formed stably.

Next, as shown in Part (B) of FIG. 15, the capillary 100 is moved down to above one of the leads 54 and presses the initial ball 104 against an upper surface of the lead 54. Then, the initial ball 104 formed at the tip end of the capillary 100 is connected with the lead 54 by the technique of thermal compression bonding in combination with ultrasonic vibration. Incidentally, the wire clamper 102 is opened at the time of this work.

Next, as shown in Part (C) of FIG. 15, in the state where the wire clamper 102 is opened, the capillary 100 is moved to above an electrode pad 68 of the semiconductor element 60 while drawing a certain loop trajectory. Then, after the wire clamper 102 holds the copper wire 101, the capillary 100 is moved down to above the electrode pad 68 and presses the copper wire 101 against an upper surface of a gold ball 62 on the electrode pad 68. Next, the copper wire 101 is connected with the gold ball 62 by the technique of thermal compression bonding in combination with ultrasonic vibration. Subsequently, the capillary 100 is moved up, the copper wire 101 is drawn from the tip end of the capillary 100 to have a length required for an initial ball, and then the copper wire 101 is cut. Then, the copper wire 101 drawn from the tip end of the capillary 100 is processed into the initial ball as described above.

Thereafter, the wire bonding work described by using Parts (A) to (C) of FIG. 15 is repeatedly performed on the gold ball 62 on each electrode pad 68 of the semiconductor element 60 and the corresponding lead 54. It should be noted that the gold ball 62 is beforehand connected with the electrode pad 68 before the wire bonding step, and thereby the problem of a splash and the problem of a crack in the insulating layer are solved as described by using FIG. 10.

Next, as shown in Part (A) of FIG. 16, resin molding is performed on each group block on the lead frame 63 to form common resin packages 105. For example, a sheet 106 for resin molding (see Part (B) of FIG. 16) is attached to the lead frame 63 on the back surface side by using a resinous adhesive or the like, and then the lead frame 63 is placed in a resin encapsulation mold. Subsequently, an insulating resin is filled into the resin encapsulation mold, and thereby the common resin packages 105 are formed on a group block basis. As described above, each common resin package 105 includes the four mounting portions 64.

Lastly, as shown in Part (B) of FIG. 16, the common resin packages 105 on the lead frame 63 are cut on a mounting portion 64 basis to be divided into individual resin packages 52. In cutting, a dicing blade 107 of a dicing apparatus is used to simultaneously dice the common resin packages 105 and the lead frame 63 along dicing lines 108. At this time, the sheet 106 is cut only partially, and thereby the individual resin packages 52 divided into pieces are supported on the sheet 106. Meanwhile, in this embodiment, the hatched regions of the leads 54 shown in Part (A) of FIG. 9 are arranged on the dicing lines 108. The leads 54 are cut in recessed regions by the dicing blade 107, and thereby the burden of the dicing blade 107 is reduced, so that long time use thereof is enabled.

Note that in this embodiment, the temperature of the inert gas blown into the opening region 96 of the clamper 94 is not particularly limited. However, for example, a case may be employed in which, after installation or the like of a heating mechanism in the clamper 94, the inert gas is thereby heated to a temperature equal to that in the opening region 96 and then is blown into the opening region 96. In this case, the copper wire 101 is difficult to cool due to the inert gas, and the current efficiency in forming the initial ball can be enhanced.

In addition, the description has been given of the case in which the work is performed in the wire bonding while the top portion of the opening region 96 of the clamper 94 is not covered with a lid member such as a plate, but the embodiment is not limited to this case. For example, a case may be employed in which the top portion of the opening region 96 is covered with a lid member having an opening only above the work region, and in which the lid member slides according to the work region. In this case, the top portion of the opening region 96 is mostly covered with the lid member, and thereby the inside of the opening region 96 can be easily filled with the inert gas. Thus, an amount of supplying the inert gas is reduced, so that an effect of reducing the manufacturing cost can also be obtained.

Moreover, the description has been given of the case where the gold ball 62 is formed on the electrode pad 68, and then the wire bonding using the copper wire 61 is performed, but the embodiment is not limited to the case. For example, a case may be employed in which the electrode pads have the structure described by using FIG. 11 and FIG. 12 and in which each copper wire is thereby directly wire-bonded to the corresponding electrode pad.

Meanwhile, the description has been given of the case in which the individual leads 54 are fixed in the lead fixing regions 97 of the clamper 94, respectively, but the embodiment is not limited to this case. For example, a case may be employed in which leads are divided into groups of multiple adjacent leads in accordance with the lead arrangement state such as the shape of the leads or the height of the leads, and are fixed in lead fixing regions. In this case, the number of the lead fixing regions is smaller than the total number of the leads, but a method of blowing the inert gas is the same as the method of blowing the inert gas through between the lead fixing regions as described. In addition, various modifications can be made without departing from the gist of the invention.

The invention claimed is:

1. A semiconductor device comprising:
an island;
a plurality of leads surrounding the island;
a semiconductor element attached to the island with an adhesive;
copper wires which electrically connect electrode pads of the semiconductor element and corresponding leads; and
a resin package which covers the island, the leads, the copper wires, and the semiconductor element,
wherein one of the electrode pads comprises a buffer layer, and a copper wire is ball-bonded to the one of the electrode pads, and
the buffer layer is an electrode layer harder than a metal layer forming the one of the electrode pads and is broken in the one of the electrode pads.

2. The semiconductor device according to claim 1, wherein a plurality of through-holes are formed in the island around a fixing region of the semiconductor element, and the through-holes are filled with a resin of the resin package.

3. The semiconductor device according to claim 2, wherein a shape of the through-holes is a circle, an ellipse or a rectangle, and a width of each of the through-holes is a width equal to or larger than an interval between two adjacent leads.

4. A semiconductor device comprising:
an island;
a plurality of leads surrounding the island;
a semiconductor element attached to the island with an adhesive;
copper wires which electrically connect electrode pads of the semiconductor element and corresponding leads; and
a resin package which covers the island, the leads, the copper wires, and the semiconductor element,
wherein one of the electrode pads comprises a buffer layer, and a copper wire is ball-bonded to the one of the electrode pads,
the one of the electrode pads is exposed from an opening portion of a shield layer covering a surface of the semiconductor element, and the buffer layer has a smaller area than an opening of the opening portion and is disposed inside the opening portion, and
a part of a metal layer forming the one of the electrode pads, other than the buffer layer, is disposed between the copper wire and the buffer layer so that the copper wire and the buffer layer are not in direct contact.

* * * * *